US012800856B2

(12) United States Patent
Tanaka et al.

(10) Patent No.: US 12,800,856 B2
(45) Date of Patent: Nov. 17, 2026

(54) MICROELECTRONICS PACKAGES WITH PHOTO-INTEGRATED GLASS INTERPOSER

(71) Applicant: Intel Corporation, Santa Clara, CA (US)

(72) Inventors: Hiroki Tanaka, Gilbert, AZ (US); Robert Alan May, Chandler, AZ (US); Kristof Darmawikarta, Chandler, AZ (US); Bai Nie, Chandler, AZ (US); Brandon C. Marin, Gilbert, AZ (US); Jeremy D. Ecton, Gilbert, AZ (US); Srinivas Venkata Ramanuja Pietambaram, Chandler, AZ (US); Changhua Liu, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 136 days.

(21) Appl. No.: 17/958,002

(22) Filed: Sep. 30, 2022

(65) Prior Publication Data

US 2024/0112972 A1 Apr. 4, 2024

(51) Int. Cl.
*H10W 70/692* (2026.01)
*G02B 6/42* (2006.01)
*G02B 6/43* (2006.01)

(52) U.S. Cl.
CPC ......... *G02B 6/4259* (2013.01); *G02B 6/4204* (2013.01); *G02B 6/426* (2013.01); *G02B 6/43* (2013.01); *H10W 70/692* (2026.01)

(58) Field of Classification Search
None
See application file for complete search history.

(56) References Cited

U.S. PATENT DOCUMENTS 7,373,033 B2 * 5/2008 Lu ........................ G02B 6/4246 257/432
7,391,937 B2 * 6/2008 Thorson ............... G02B 6/2817 385/14

(Continued)

FOREIGN PATENT DOCUMENTS

EP 1688770 A1 8/2006
EP 2000833 A1 12/2008

OTHER PUBLICATIONS

International Preliminary Report on Patentability from PCT/US2023/031563 notified Apr. 10, 2025, 8 pgs.

(Continued)

*Primary Examiner* — Jerry Rahll
(74) *Attorney, Agent, or Firm* — Essential Patents Group, LLP

(57) ABSTRACT

Disclosed herein are microelectronics package architectures utilizing photo-integrated glass interposers and photonic integrated glass layers and methods of manufacturing the same. The microelectronics packages may include an organic substrate, a photonic integrated glass layer, and a glass interpose. The organic substrate may define through substrate vias. The photonic integrated glass layer may be attached to the organic substrate. The photonic integrated glass layer may include photo detectors. The glass interposer may be attached to the organic substrate. The glass interposer may define through glass vias in optical communication with the photo detectors.

24 Claims, 27 Drawing Sheets

(56) References Cited

U.S. PATENT DOCUMENTS

| | | | | |
|---|---|---|---|---|
| 2004/0126058 | A1* | 7/2004 | Lu | G02B 6/43 385/33 |
| 2004/0264837 | A1 | 12/2004 | Ogawa | |
| 2007/0297729 | A1* | 12/2007 | Kodama | H05K 1/0274 385/94 |
| 2012/0163811 | A1 | 6/2012 | Doany et al. | |
| 2016/0274320 | A1 | 9/2016 | Guidotti et al. | |
| 2017/0047312 | A1 | 2/2017 | Budd et al. | |
| 2020/0209496 | A1* | 7/2020 | Fish | G02B 6/4204 |
| 2020/0279840 | A1 | 9/2020 | Janta-Polczynski et al. | |
| 2022/0404551 | A1* | 12/2022 | Tadayon | H05K 1/0274 |

OTHER PUBLICATIONS

International Search Report and Written Opinion from PCT/US2023/031563 notified Dec. 20, 2023, 12 pgs.
Extended European Search Report from European Patent Application No. 23873426.3 notified Aug. 6, 2026, 9 pgs.

* cited by examiner

MICROELECTRONICS PACKAGES WITH PHOTO-INTEGRATED GLASS INTERPOSER

FIELD OF THE DISCLOSURE

The present subject matter relates to microelectronics packages. More specifically, the present disclosure relates to microelectronics packages with photo-integrated glass and glass interposers and methods of manufacturing the same.

BACKGROUND

Packaging technology may use an active base die (Si interposer) which has billions of transistors to compute. It has few advantages compared to Intel 2.5D (EMIB) packaging solutions with passive base die (No transistors) such as Higher bandwidth, Reduced latency, and Power efficiency since die-to-die interconnections are much shorter in 3D stacking architecture. In general, copper-based interconnects can offer data rate of 25-50 Gbps on printed circuit board (PCB). However, switches, Ethernet, and some other higher-end applications require data rate of more than 100 Gbps.

BRIEF DESCRIPTION OF THE FIGURES

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

To achieve data rates greater than 50 Gbps on PCBs, optical communication may be utilized. In addition, co-embedded photonic integrated circuit (EPIC) architecture may be used to increase design flexibility. As disclosed herein, optical co-EPIC 3D packaging with photo-integrated glass (PIG) may be used to achieve high-speed signaling and maintain benefits of 3D packaging technology.

As disclosed herein, microelectronics package may include organic substrates, photonic integrated glass layers, glass interposers, and photo detectors that may allow for signals to be transmitted between dies, motherboards, peripherals, etc. a high speed (i.e., in excess of 50 Gbps). The organic substrates may define through substrate vias that form optical pathways with the photonic integrated glass layers and through glass vias of the glass interposer. The photo detectors may be used to convert the optical (i.e., light) signals to electrical signals for use by one or more dies.

The above discussion is intended to provide an overview of subject matter of the present patent application. It is not intended to provide an exclusive or exhaustive explanation. The description below is included to provide further information.

Figure 1:
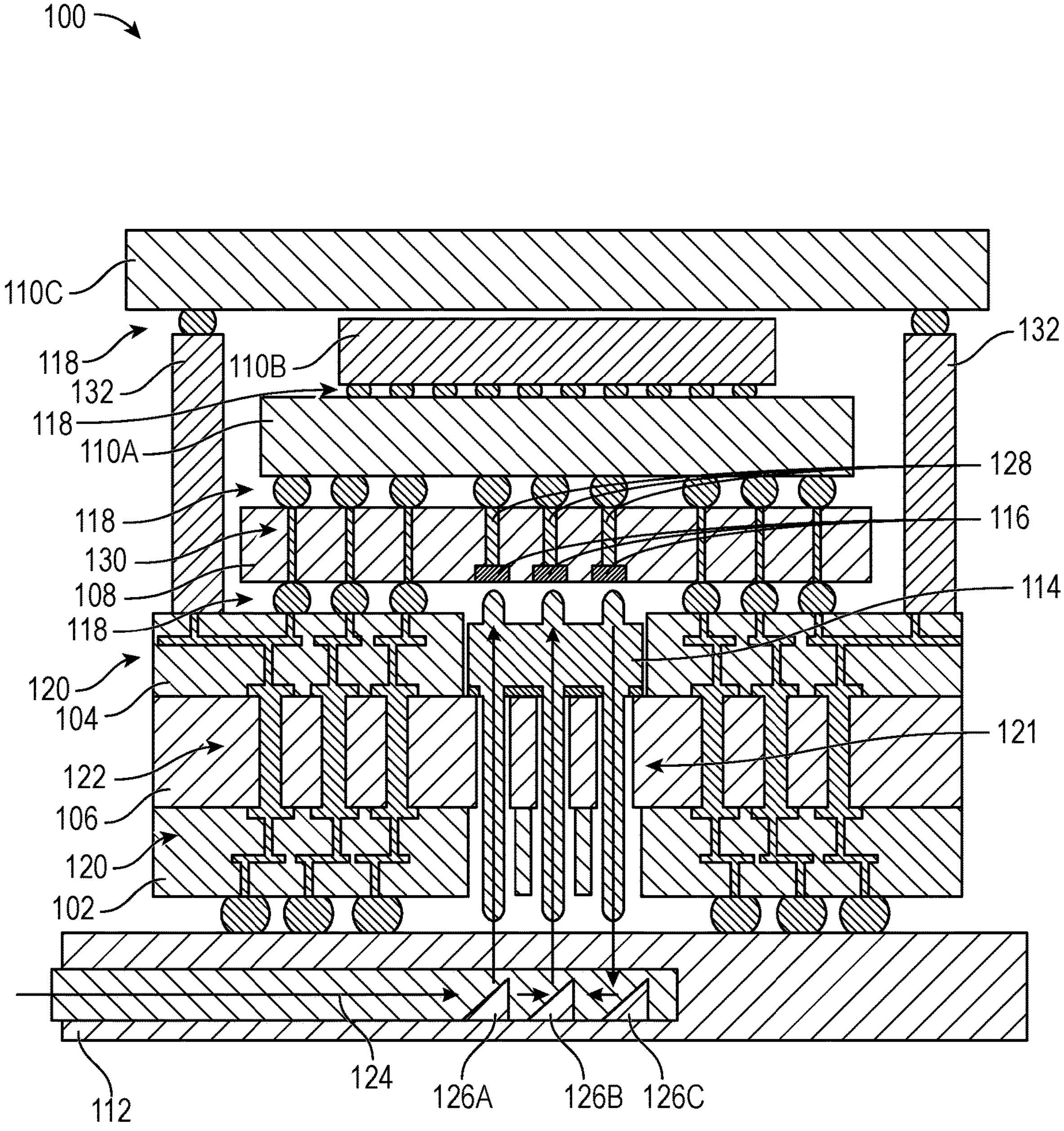
FIG. 1 shows a microelectronics package in accordance with at least one example of this disclosure.

Turning now to the figures, FIG. 1 shows a microelectronics package 100 in accordance with at least one example of this disclosure. Microelectronics package 100 may include a first substrate 102, a second substrate 104, a glass interposer 106, a photonic integrated glass layer 108, dies 110 (labeled individually as dies 110A, 110B, and 110C), a motherboard 112, and lens 114, and photo detectors 116. Various bumps 118 may be used to electrically connect the various components of microelectronics package 100. First and second substrates 102, 104 may have traces 120.

Glass interposer 106 may have a first subset of through holes 121 and a second set of through holes 122. First subset of through holes 121 may allow portions of lens 114 to pass through glass interposer 106 and form one or more optical pathways through glass interposer 106. During operation, optical signals may travel along optical paths 124. The optical signals may travel through motherboard 112 and be deflected by one or more mirrors 126 (labeled individually as mirrors 126A, 126B, and 126C) and travel to lens 114 and be received by photo detectors 116.

Photo detectors 116 may convert the optical signal into electrical signals that may pass through one or more vias 128 of photonic integrated glass layer 108. Photo detectors 126 may be diodes, such as light emitting diodes, or other components that can covert electrical signals into optical signals and/or convert optical signals into electrical signals. Thus, during operations, optical signals may be received by photo detectors 116 and converted to electrical signals for processing by dies 110 and electrical signals produced by dies 110 may be converted into optical signals by photo detectors 116 and transmitted along optical pathways 124.

Second subset of though holes 122 and holes 130 in photonic integrated glass layer 108 may be plated or otherwise filled with a conductive material for transmission of power and/or electrical signals. For example, second subset of holes 122 and holes 130 may be copper plated to allow power and/or electrical signals to be transmitted through photonic integrated glass layer 108 and glass interposer 106.

Pillars 132 may supply support for and deliver power or electrical signals to one or more of dies 110. Pillars 132 may be a metallic material, such as copper to provide electrical connections as well as structural support. Pillars 132 may be glass to provide signal transmission as well as structural support. For example, pillars 132 may be copper and provide support for and deliver power to die 110C.

Figure 2:
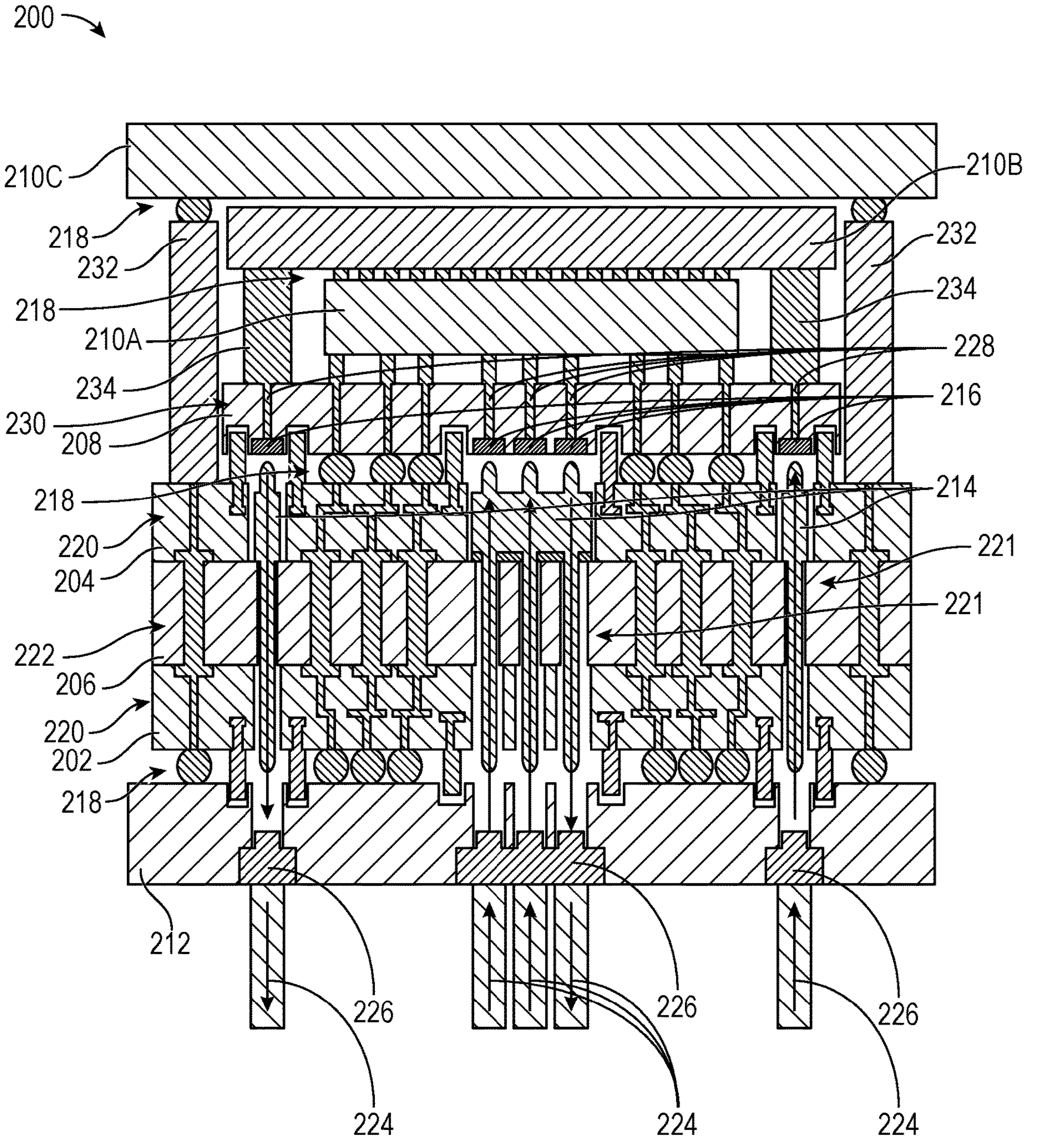
FIG. 2 shows a microelectronics package in accordance with at least one example of this disclosure.

FIG. 2 shows a microelectronics package 200 in accordance with at least one example of this disclosure. Microelectronics package 200 may include a first substrate 202, a second substrate 204, a glass interposer 206, a photonic integrated glass layer 208, dies 210 (labeled individually as dies 210A, 210B, and 210C), a motherboard 212, and lens 214, and photo detectors 216. Various bumps 218 may be used to electrically connect the various components of microelectronics package 200. First and second substrates 202, 204 may have traces 220.

Glass interposer 206 may have a first subset of through holes 221 and a second set of through holes 222. First subset of through holes 221 may allow portions of lens 214 to pass through glass interposer 206 and form one or more optical pathways through glass interposer 206. During operation, optical signals may travel along optical paths 224. The optical signals may travel through motherboard 212 and glass portions 226, which may seal through holes passing through motherboard 212, and travel to lens 214 and be received by photo detectors 216.

As disclosed herein, photo detectors 216 may convert the optical signal into electrical signals that may pass through one or more vias 228 of photonic integrated glass layer 208. Photo detectors 226 may be diodes, such as light emitting diodes, or other components that can covert electrical signals into optical signals and/or convert optical signals into electrical signals. Thus, during operations, optical signals may be received by photo detectors 216 and converted to electrical signals for processing by dies 210 and electrical signals produced by dies 210 may be converted into optical signals by photo detectors 216 and transmitted along optical pathways 224.

Second subset of though holes 222 and holes 230 in photonic integrated glass layer 208 may be plated or otherwise filled with a conductive material for transmission of power and/or electrical signals. For example, second subset of holes 222 and holes 230 may be copper plated to allow power and/or electrical signals to be transmitted through photonic integrated glass layer 208 and glass interposer 206.

Pillars 232 may supply support for and deliver power or electrical signals to one or more of dies 210. Pillars 232 may be a metallic material, such as copper to provide electrical connections as well as structural support. Pillars 232 may be glass to provide signal transmission as well as structural support. For example, pillars 232 may be copper and provide support for and deliver power to die 210C.

Photonic integrated glass layer 208 may extend beyond die 210A to provide for optical communications with die 210B. Pillars 234 may extend from photonic integrated glass layer 208 to provide support and signal transmission to die 210B. For example, pillars 234 may be copper pillars and provide power and/or electrical signal as well as structural support for die 210B.

Figure 3:
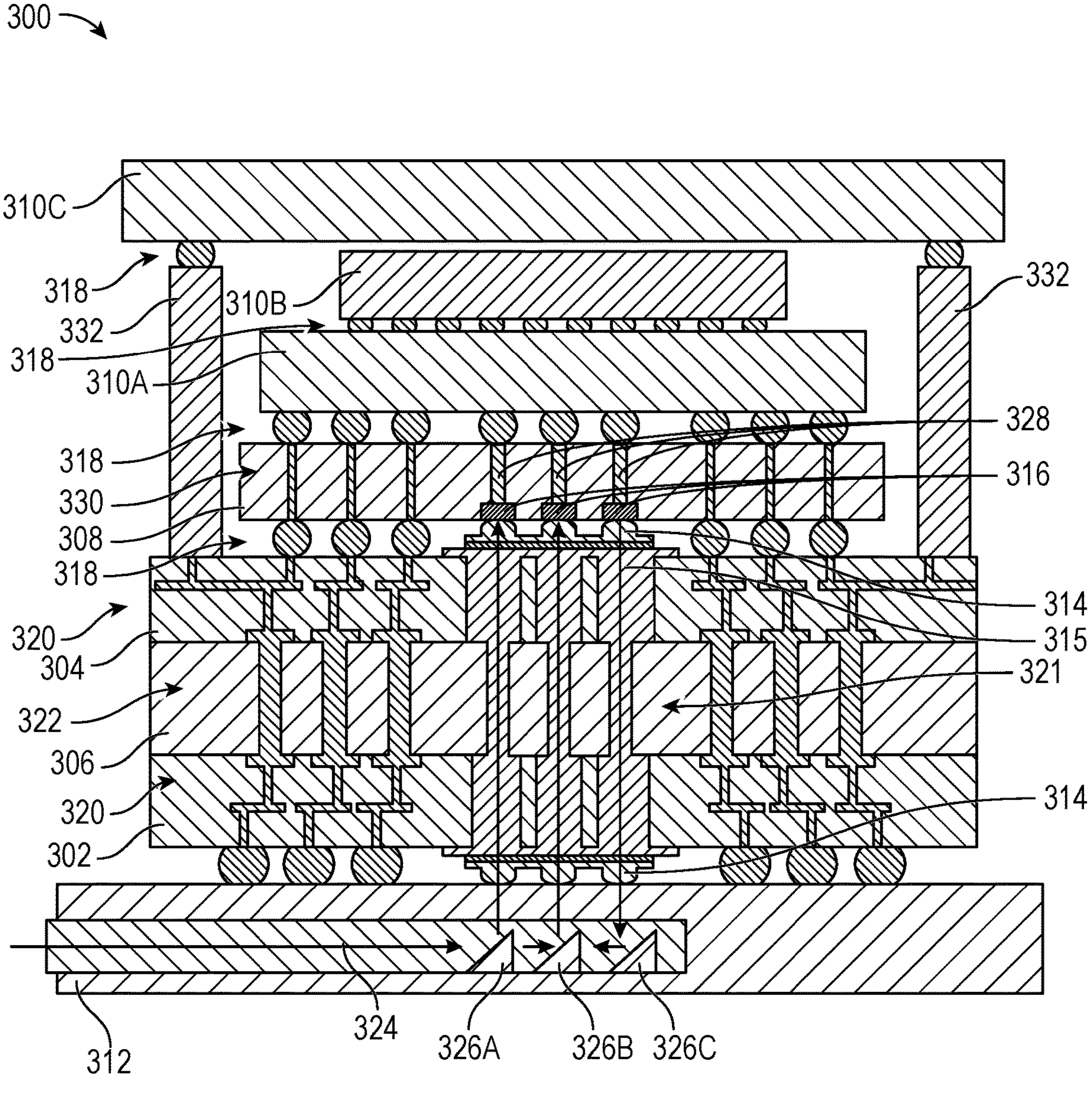
FIG. 3 shows a microelectronics package in accordance with at least one example of this disclosure.

FIG. 3 shows a microelectronics package 300 in accordance with at least one example of this disclosure. Microelectronics package 300 may include a first substrate 302, a second substrate 304, a glass interposer 306, a photonic integrated glass layer 308, dies 310 (labeled individually as dies 310A, 310B, and 310C), a motherboard 312, and lenses 314, and photo detectors 316. Lenses 314 may be one or more polymer or glass lenses that may be premanufactured and installed as disclosed herein. Various bumps 318 may be used to electrically connect the various components of microelectronics package 300. First and second substrates 302, 304 may have traces 320.

Glass interposer 306 may have a first subset of through holes 321 and a second set of through holes 322. First subset of through holes 321 may be filled with a polymer 315 and form one or more optical pathways through glass interposer 306. Polymer 315 may be omitted in examples disclosed herein. During operation, optical signals may travel along optical paths 324. The optical signals may travel through motherboard 312, lenses 314, and polymer 315, and be received by photo detectors 316.

As disclosed herein, photo detectors 316 may convert the optical signal into electrical signals that may pass through one or more vias 328 of photonic integrated glass layer 308. Photo detectors 326 may be diodes, such as light emitting diodes, or other components that can covert electrical signals into optical signals and/or convert optical signals into electrical signals. Thus, during operations, optical signals may be received by photo detectors 316 and converted to electrical signals for processing by dies 310 and electrical signals produced by dies 310 may be converted into optical signals by photo detectors 316 and transmitted along optical pathways 324.

Second subset of though holes 322 and holes 330 in photonic integrated glass layer 308 may be plated or otherwise filled with a conductive material for transmission of power and/or electrical signals. For example, second subset of holes 322 and holes 330 may be copper plated to allow power and/or electrical signals to be transmitted through photonic integrated glass layer 208 and glass interposer 306.

Pillars 332 may supply support for and deliver power or electrical signals to one or more of dies 310. Pillars 332 may be a metallic material, such as copper to provide electrical connections as well as structural support. Pillars 332 may be glass to provide signal transmission as well as structural support. For example, pillars 332 may be copper and provide support for and deliver power to die 310C. Photonic integrated glass layer 308 may extend beyond die 310A to provide for optical communications with die 310B as disclosed with respect to photonic integrated glass layer 208 and die 210A to provide signal communications and support for die 310B.

Figure 4:
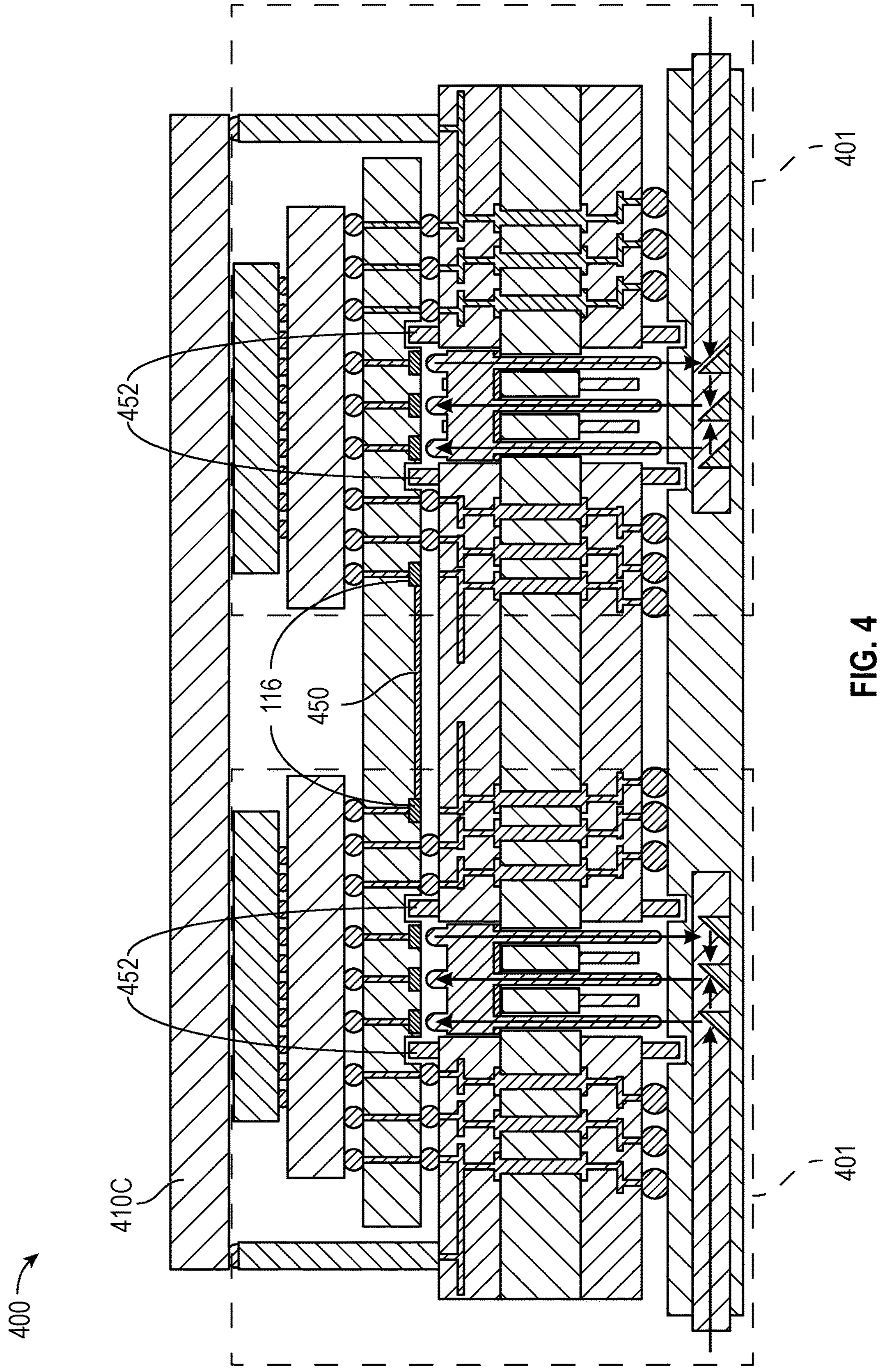
FIG. 4 shows a microelectronics package in accordance with at least one example of this disclosure.

FIG. 4 shows a microelectronics package 400 in accordance with at least one example of this disclosure. Microelectronics package 400 may include two or more microelectronics packages 401, such as microelectronics package 100 as shown in FIG. 1. However, as shown in FIG. 4, first substrate 102, second substrate 104, glass interposer 106, photonic integrated glass layer 108, and motherboard 112 may extend such that more than one set of the vias, traces, optical paths, etc. disclosed with respect to microelectronics package 100 may be reproduced multiple times. For example, the various vias, traces, and optical paths described with respect to microelectronics package 401 may be reproduced twice as shown in FIG. 4. Dies, such as dies 110B for each of microelectronics packages 401 may be connected to a larger dies 410C. Thus, dies 110B from each of microelectronics packages 401 may transmit signals to and receive signals from die 410C.

Photonic integrated glass layer 108 may include a waveguide 450. Waveguide 450 may provide an optical path between photo detectors 116 is two different microelectronics packages 401. For example, as shown in FIG. 4, waveguide 450 may allow optical signals to be transmitted and received between two adjacent microelectronics packages 401. While FIG. 4 shows microelectronics packages 400 composed of two microelectronics package 401, microelectronics package 400 may be composed of any combination of microelectronics packages 100, 200, and 300 optically coupled using waveguide 450 to allow optical communication between microelectronics packages.

Microelectronics packages 401 may also include metal walls 452. Metal walls 452 may be made of copper. As disclosed herein, metal walls 452 may prevent an epoxy under-fill material from covering optical lens 114. If the epoxy under-fill contaminates lens 114, light may be scattered and optical signal attenuations may occur.

Still consistent with embodiments disclosed herein, metal walls 452 may be excluded (i.e., not present) because an index matching epoxy under-fill may be used. In this case, even if the epoxy under-fill contacts optical lens 114, there may not be light scattering and/or light attenuations because the refractive index between lens 114 and the epoxy underfill are the same or nearly the same. As disclosed herein, embodiments with metal walls 452 and non-index matched epoxy under-fill and embodiments without metal walls 452 and index matched epoxy under-fill may be interchangeable.

Figure 5:
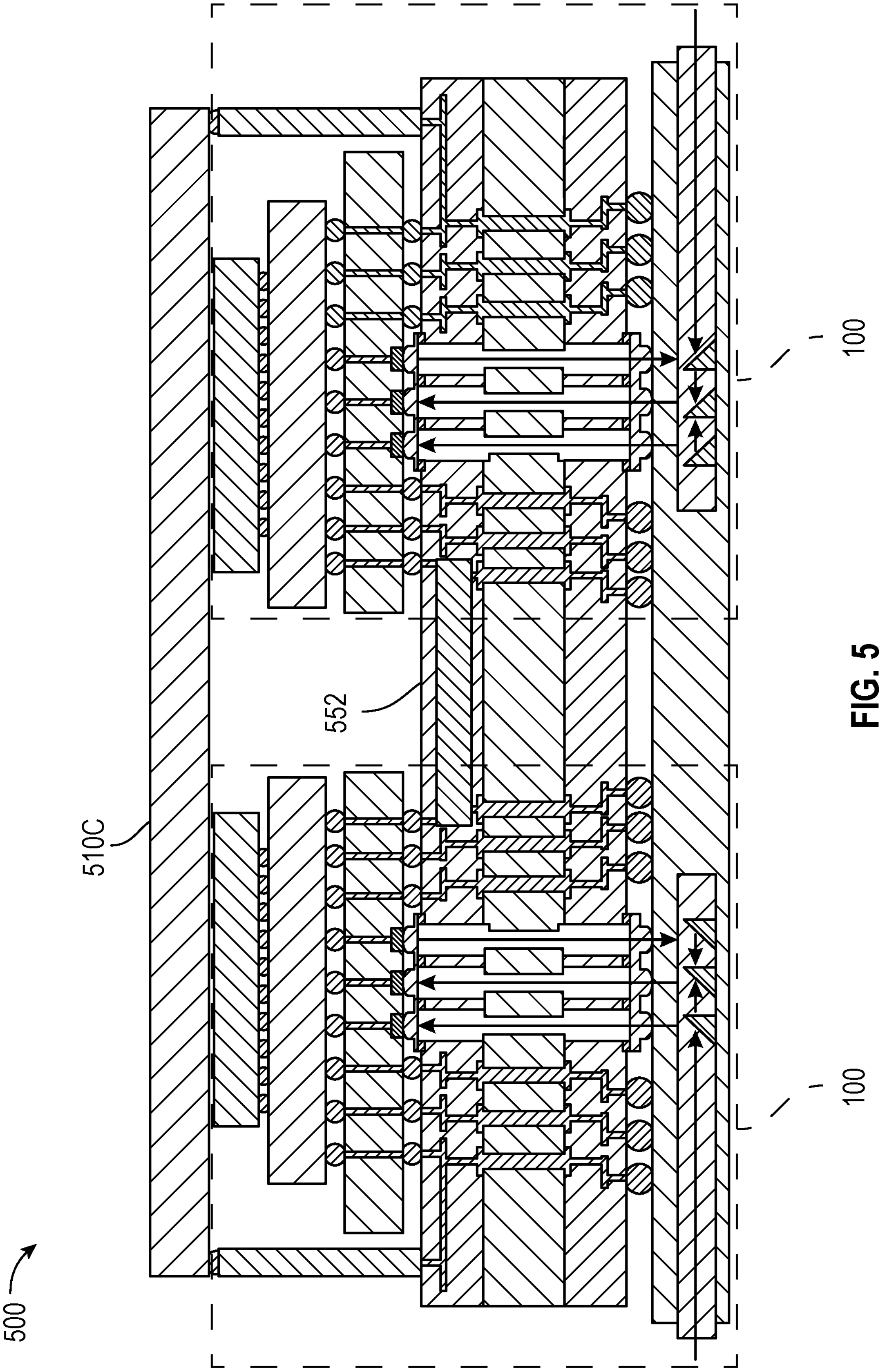
FIG. 5 shows a microelectronics package in accordance with at least one example of this disclosure.

FIG. 5 shows a microelectronics package 500 in accordance with at least one example of this disclosure. Microelectronics package 500 may include two or more microelectronics packages 100 as shown in FIG. 1. However, as shown in FIG. 5, first substrate 102, second substrate 104, glass interposer 106, photonic integrated glass layer 108, and motherboard 112 may extend such that more than one set of the vias, traces, optical paths, etc. disclosed with respect to microelectronics package 100 may be reproduced multiple times. For example, the various vias, traces, and optical paths described with respect to microelectronics package 100 may be reproduced twice as shown in FIG. 5. Dies, such as dies 110B for each of microelectronics packages 100 may be connected to a larger dies 510C. Thus, dies 110B from each of microelectronics packages 100 may transmit signals to and receive signals from die 510C.

Photonic integrated glass layer 108 may include an embedded multi-die interconnect bridge (EMIB) 552. EMIB 552 may be a silicon bridge. EMIB 552 may provide an electrical path between dies 110A of each of microelectronics packages 100. For example, as shown in FIG. 5, EMIB 552 may allow electrical signals to be transmitted and received between two adjacent microelectronics packages 100.

EMIB 552 may be a glass (EMIB-G). As such, EMIB 552 may include a plurality of electrical traces formed within or plated on surfaces of a glass structure. Thus, EMIB 552 may allow electrical signals to be transmitted and received between two adjacent microelectronics packages 100 while providing increase mechanical stability provided by a bridge.

While FIG. 5 shows microelectronics packages 500 composed of two microelectronics packages 100, microelectronics package 500 may be composed of any combination of microelectronics packages 100, 200, 300, and 400 electrically coupled using EMIB 552 to allow electrical communication between microelectronics packages.

Figure 6:
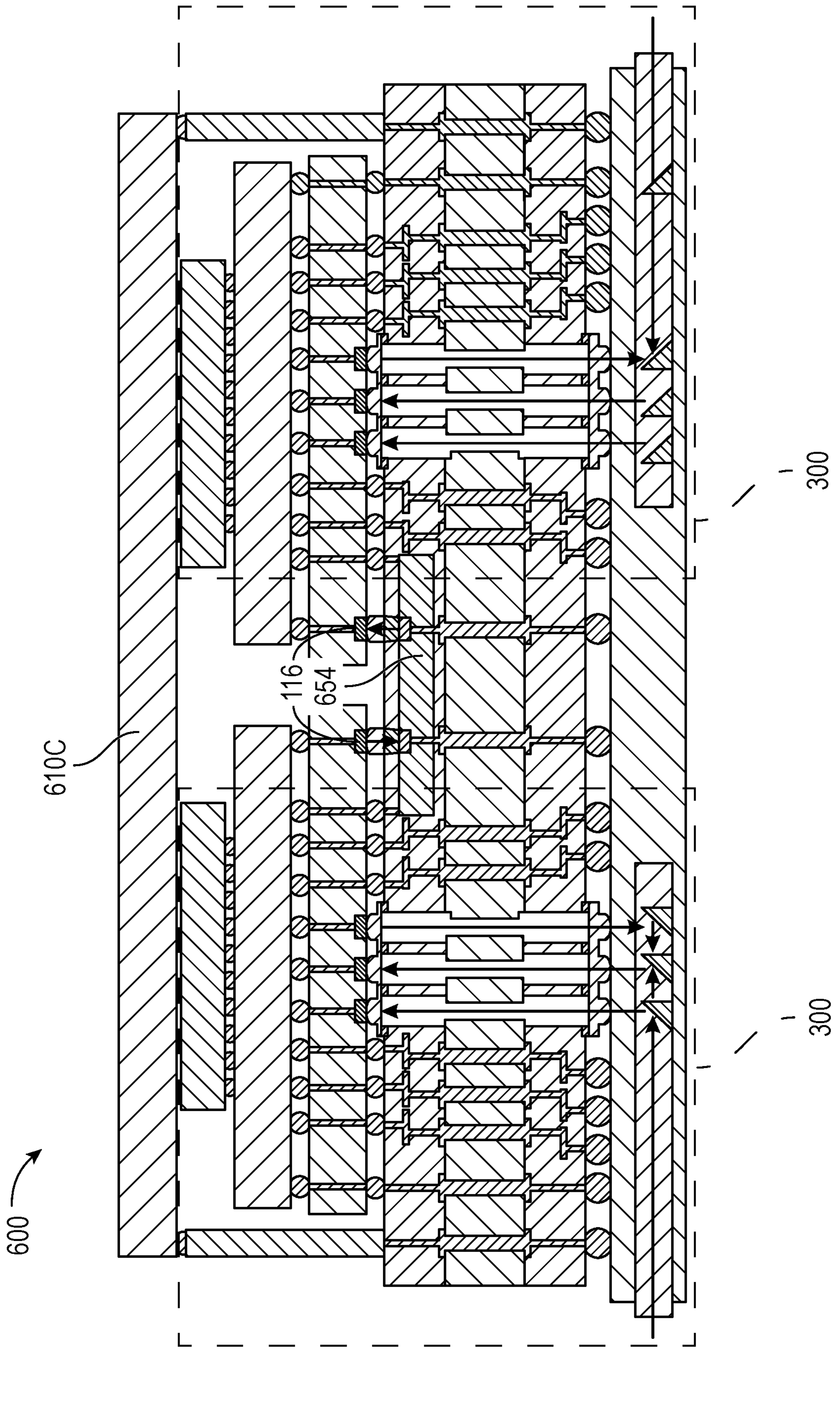
FIG. 6 shows a microelectronics package in accordance with at least one example of this disclosure.

FIG. 6 shows a microelectronics package 600 in accordance with at least one example of this disclosure. Microelectronics package 600 may include two or more microelectronics packages 300 as shown in FIG. 3. However, as shown in FIG. 6, first substrate 302, second substrate 304, glass interposer 306, photonic integrated glass layer 308, and motherboard 312 may extend such that more than one set of the vias, traces, optical paths, etc. disclosed with respect to microelectronics package 300 may be reproduced multiple times. For example, the various vias, traces, and optical paths described with respect to microelectronics package 300 may be reproduced twice as shown in FIG. 6. Dies, such as dies 310B for each of microelectronics packages 300 may be connected to a larger dies 610C. Thus, dies 310B from each of microelectronics packages 300 may transmit signals to and receive signals from die 610C.

Second substrate 304 may include photonic integrated glass layer 654. Photonic integrated glass layer 654 may be a glass layer. Photonic integrated glass layer 654 may provide an electrical path between dies 310A of each of microelectronics packages 300. For example, as shown in FIG. 3, photonic integrated glass layer 654 may allow optical and/or electrical signals to be transmitted and received between two adjacent microelectronics packages 300. Photonic integrated glass layer 654 may be a smaller version of photonic integrated glass layers 108, 208, or 308.

While FIG. 6 shows microelectronics packages 300 composed of two microelectronics packages 300, microelectronics package 600 may be composed of any combination of microelectronics packages 100, 200, 300, 400, and 500 electrically coupled using photonic integrated glass layer 654 to allow electrical communication between microelectronics packages.

Figure 7A:
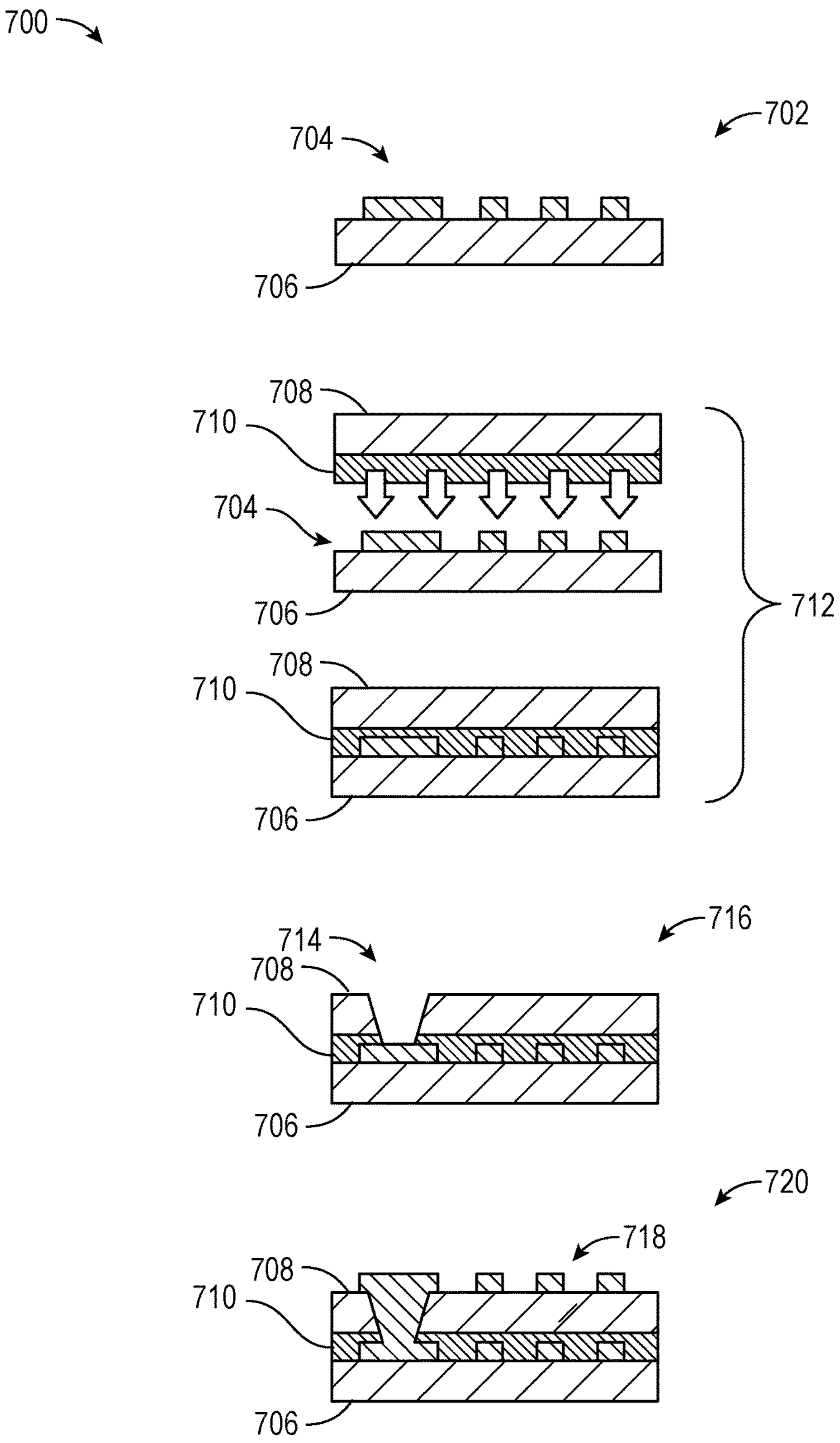
FIGS. 7A and 7B show a process flow for manufacturing a photonic integrated glass layer in accordance with at least one example of this disclosure.
Figure 7B:
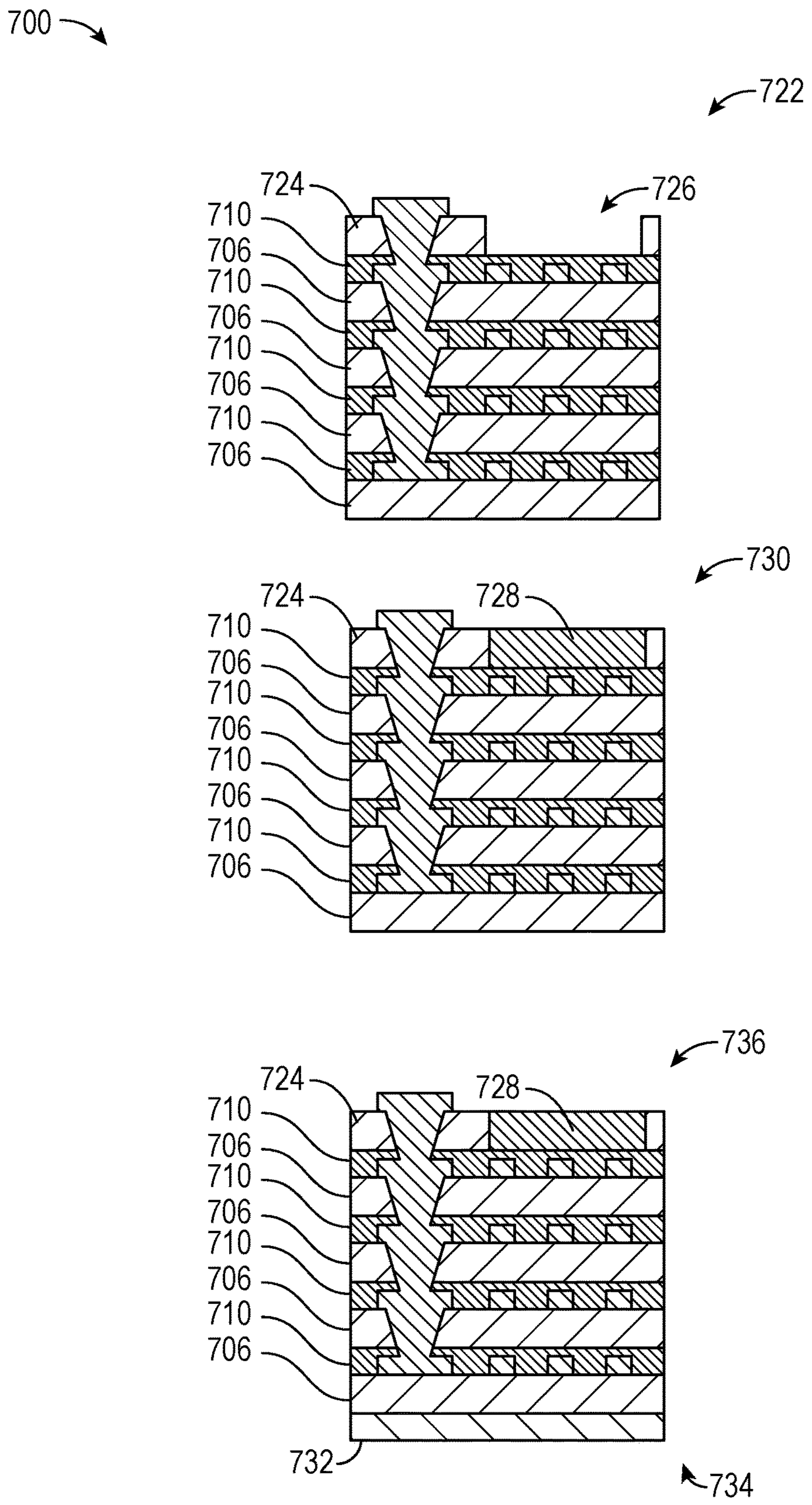

FIGS. 7A and 7B shows a process flow 700 for manufacturing a photonic integrated glass layers in accordance with at least one example of this disclosure. Process flow 700 may begin at stage 702, where copper 704 attached to a substrate 706 may be patterned. Substrate 706 may be an organic substrate or a glass substrate. After patterning copper 704 a glass layer 708 may be laminated with a dielectric material 710 (712).

After lamination glass layer 708 may be etched to form a via 714 that extends through dielectric material 710 to substrate 706 (716). After forming via 714, additional copper 718 may be deposited and patterned (720). Stages 712, 716, and 720 may be repeated multiple times to form a stack (722). Upon reaching a final lamination, a glass layer 724 may be etched to form a cavity 726 (722). After forming cavity 726 a photo detector 728 may be imbedded within cavity 726 (730). With photo detector 728 embedded, a carrier or other substrate material 732 may be attached to the bottom of a stack to form photonic integrated glass layer 734 (736).

Figure 8A:
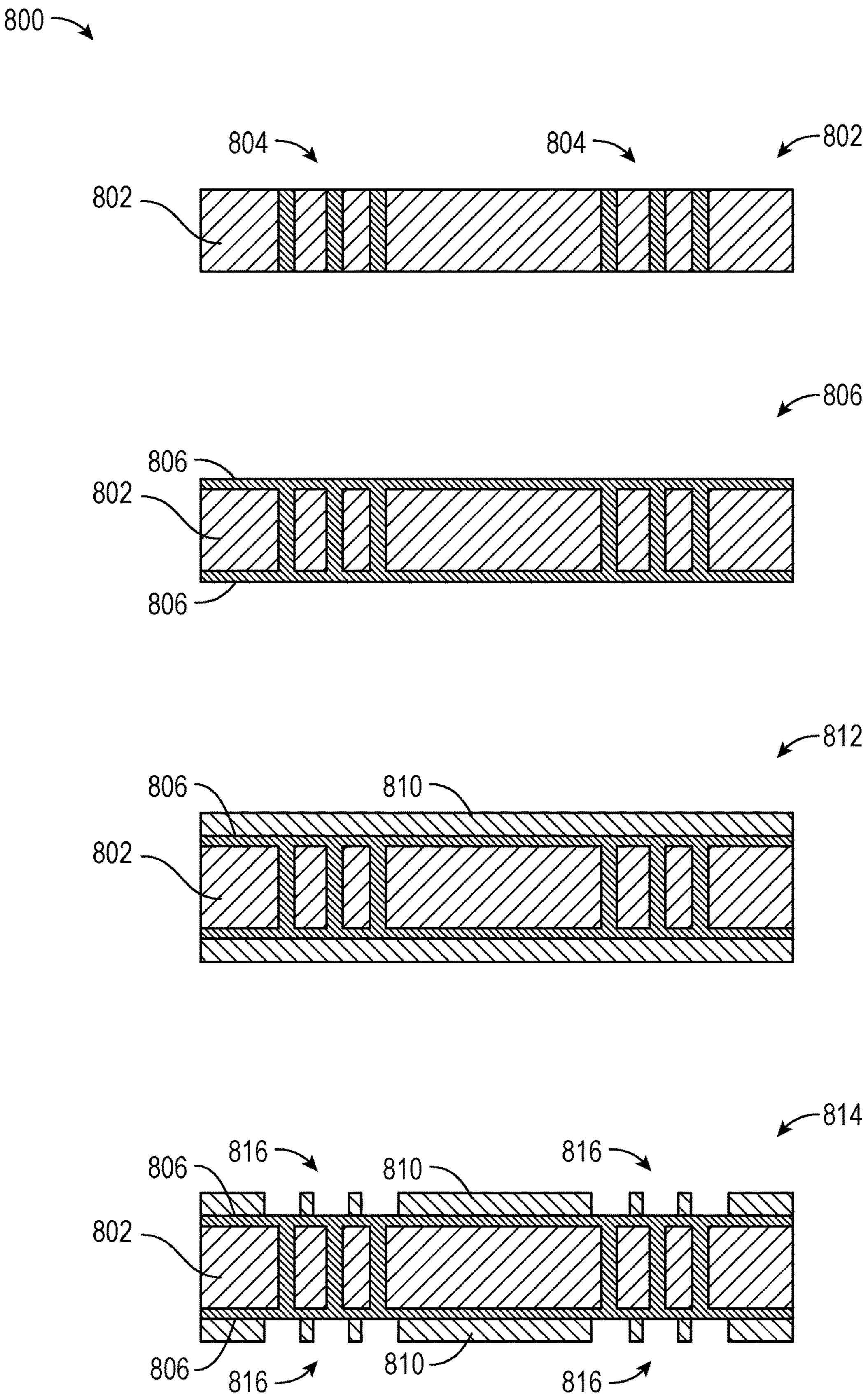
FIGS. 8A and 8B show a process flow for manufacturing a micro electronics package in accordance with at least one example of this disclosure.
Figure 8B:
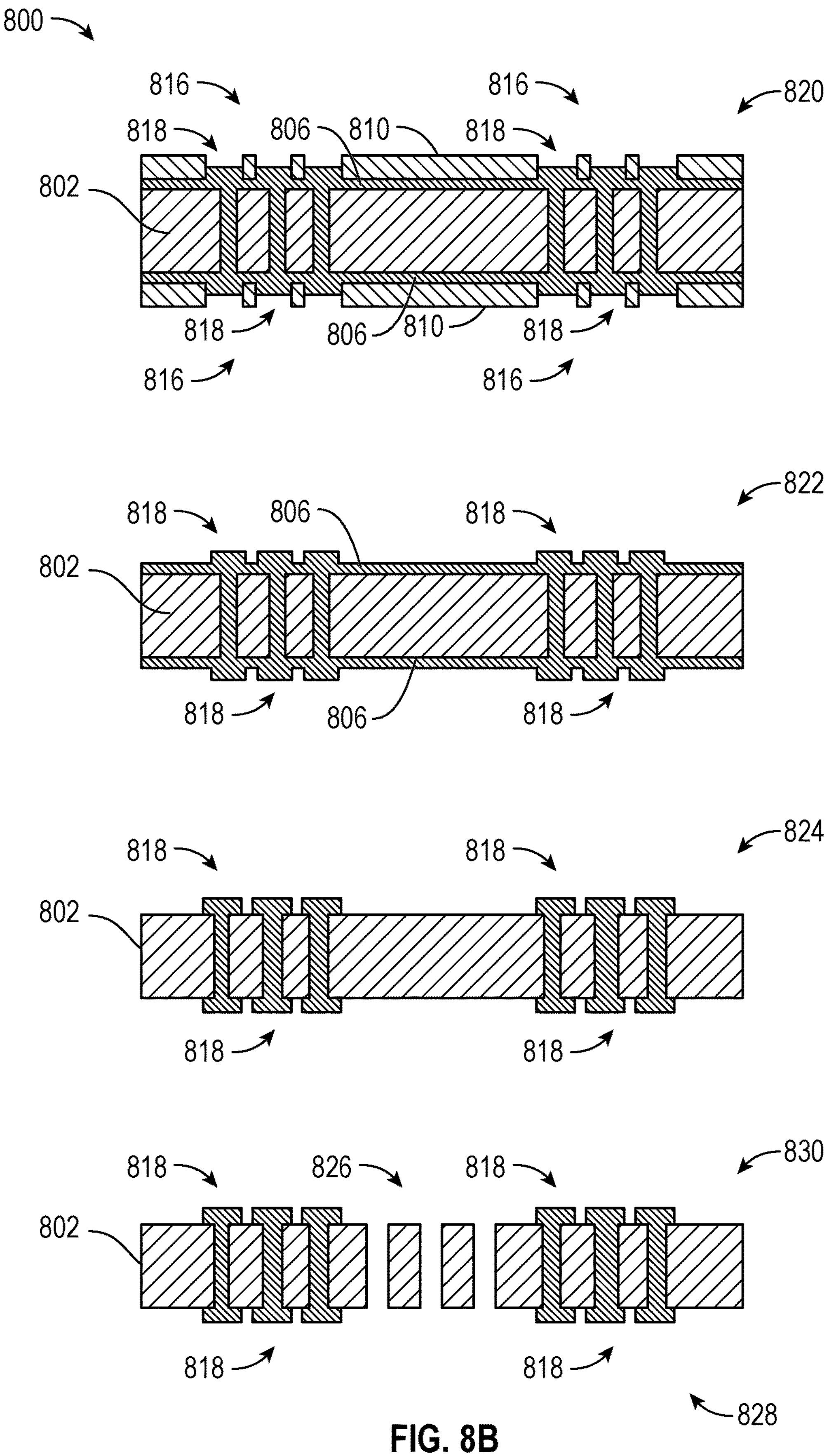
Figure 9A:
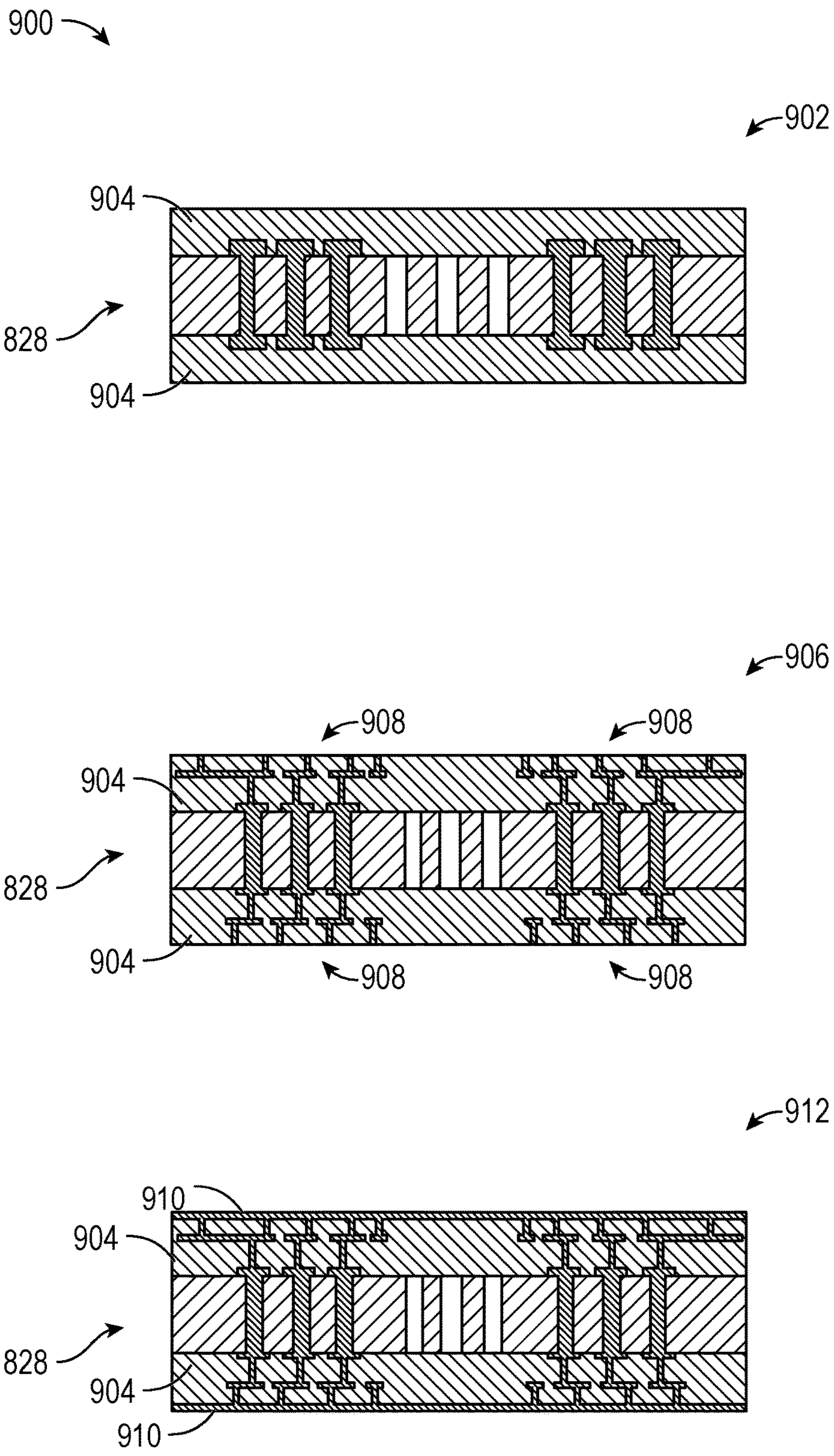
FIGS. 9A, 9B, 9C, and 9D show a process flow for manufacturing a micro electronics package in accordance with at least one example of this disclosure.
Figure 9B:
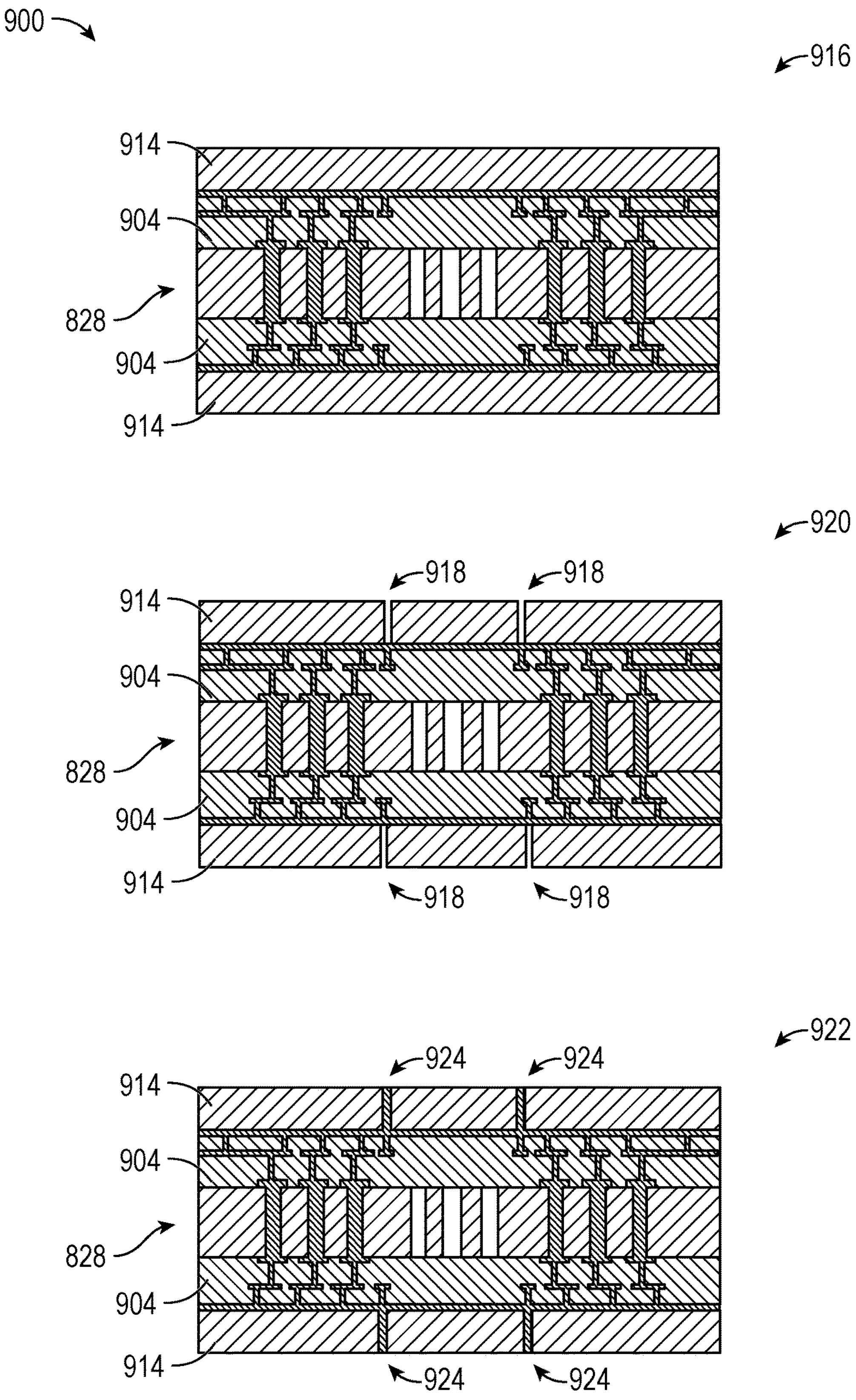
Figure 9C:
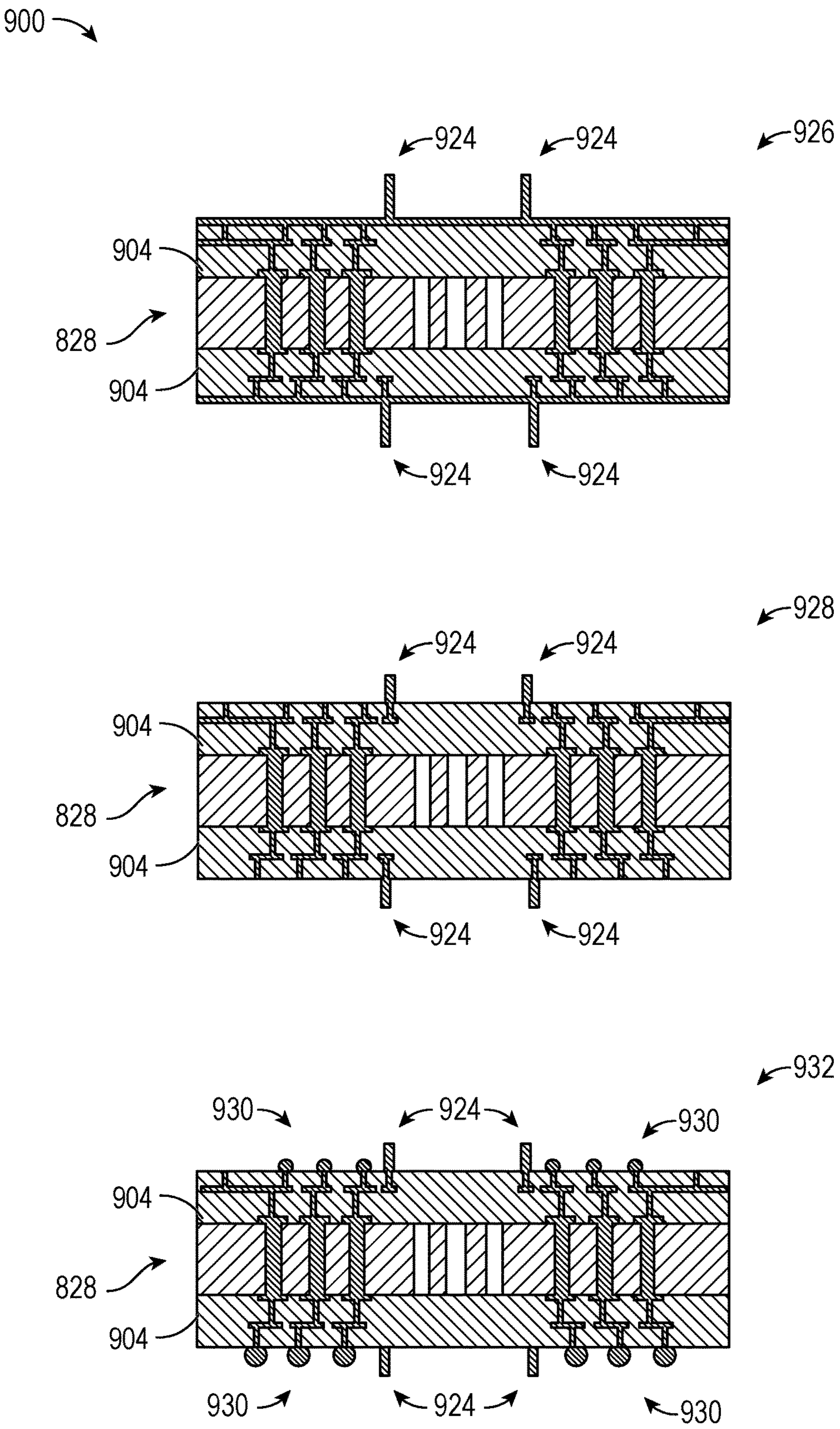
Figure 9D:
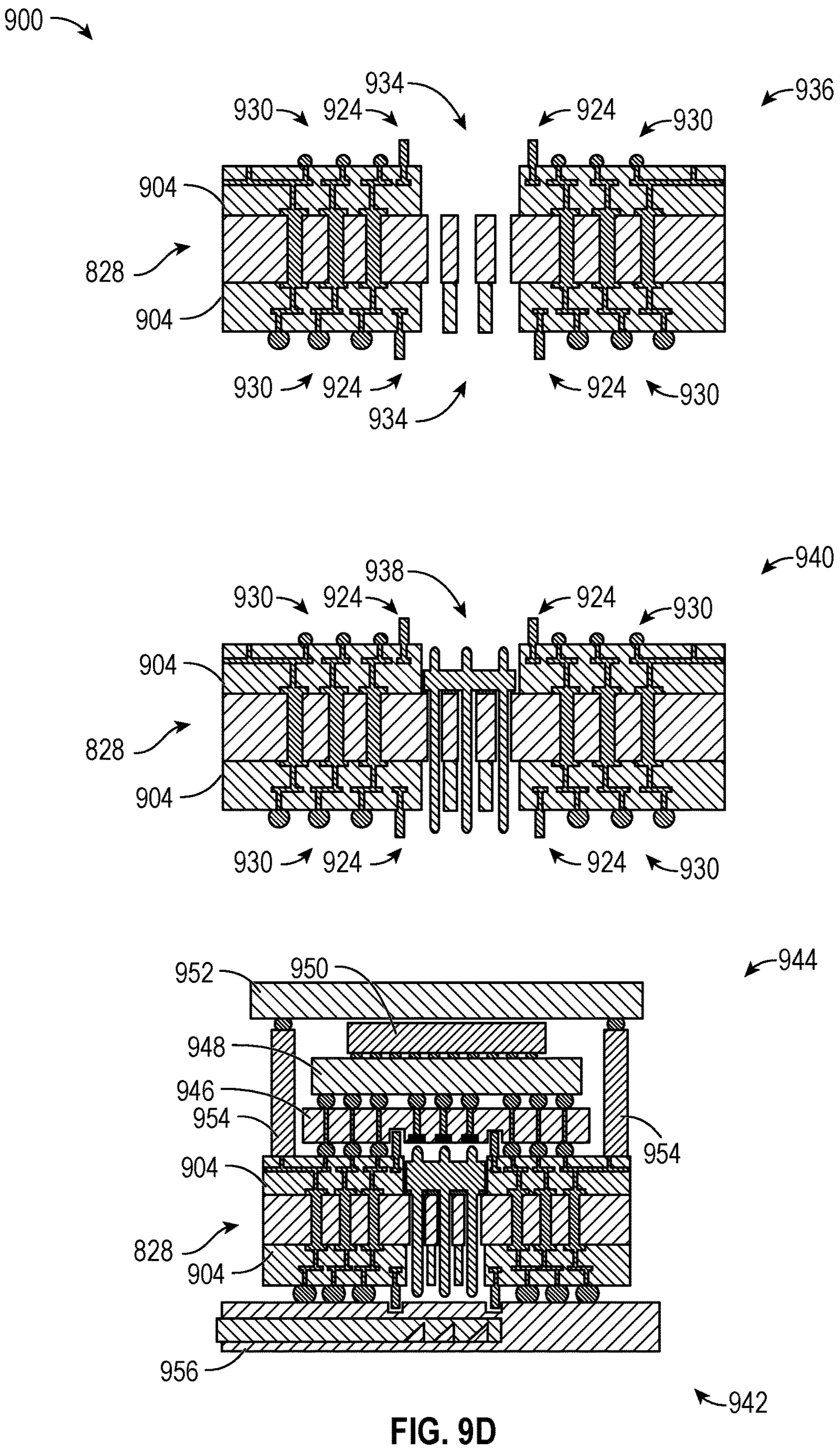

FIGS. 8A and 8B show a process flow 800 for manufacturing a microelectronics package in accordance with at least one example of this disclosure. Process flow 800 may begin at stage 802 where a glass layer 802 may be etched to form through vias 804. Through vias may plated or otherwise filled with a metallic material to form electrical pathways through glass layer 802. Since glass layer 802 will form a glass interposer, forming vias 804 may be said to be a stage in forming through vias in a glass interposer.

Once through vias 804 are formed a metallic material 806 may be deposited (808). For example, copper may be deposited on top and bottom surfaces of glass layer 802 via a seed deposition process. A resist layer 810 may be formed on metallic material 806 (812) and patterned (814) to form openings 816.

After openings 816 are formed pads 818 may be formed via a plating, sputtering, or other deposition process (820). With pads 818 formed, any remaining portions of resist layer 810 may be removed (822). With resist layer 810 removed metallic material 806 may be removed (824). For example, an etching process may be used to remove a copper seed material. With metallic material 806 removed, through holes 826 may be formed in glass layer 802 to form glass interposer 828 (830). Through holes 826 may be formed via an etching process, laser driller, etc.

FIGS. 9A, 9B, 9C, and 9D show a process flow 900 for manufacturing micro electronics package in accordance with at least one example of this disclosure. Process flow 900 may be a continuation of process flow 800 and may begin at stage 902 where dielectric layers 904 may be formed. Dielectric layers 904 may be formed on glass interposer 828 by a lamination process.

Dielectric layers 904 may be patterned (906) to form traces 908 within dielectric layers 904. Traces 908 may form electrical pathways from vias within glass interposer 828 to surfaces of dielectric layers 904. After forming traces, a seed material 910 may be deposited (912) on surfaces of dielectric layers 904. After depositing seed material resist layers 914 may be formed (916).

Cavities 918 may be formed (920) in resist layers 914 via a lithography process, laser drilling, etc. Cavities 918 may be plated with plated (922) with a metallic material 924 (e.g., copper). Resist layers 914 may be stripped (926) and seed material 910 may be etched (928) to remove seed material 910. With seed material 910 removed micro balls/bumps 930 may be formed (932). Cavities 934 may be formed (936) in dielectric layers 904, which may be organic substrate layers. After forming cavities 934, lens 938 may be installed (940) in cavities 934.

With lens 938 installed microelectronics package 942 may be assembled (944). Assembling microelectronics package 942 may include attaching a photonic integrated glass layer 946 to bumps 930 and die 948 to photonic integrated glass layer 946. Dies 950 and 952 may be stacked upon die 948. Pillars 954 may be installed and motherboard 956 attached to bumps 930.

Figure 10A:
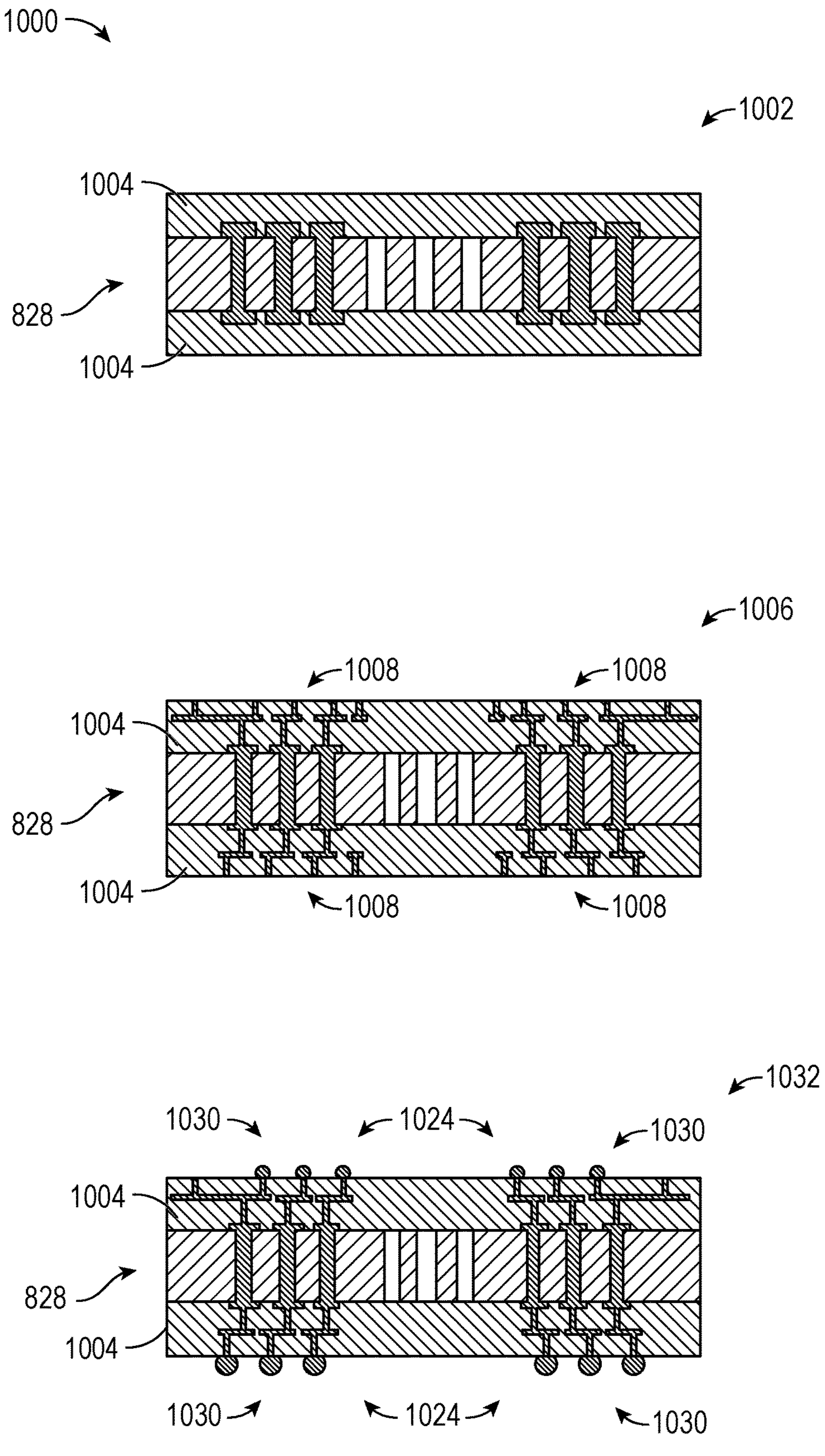
FIGS. 10A and 10B show a process flow for manufacturing a micro electronics package in accordance with at least one example of this disclosure.
Figure 10B:
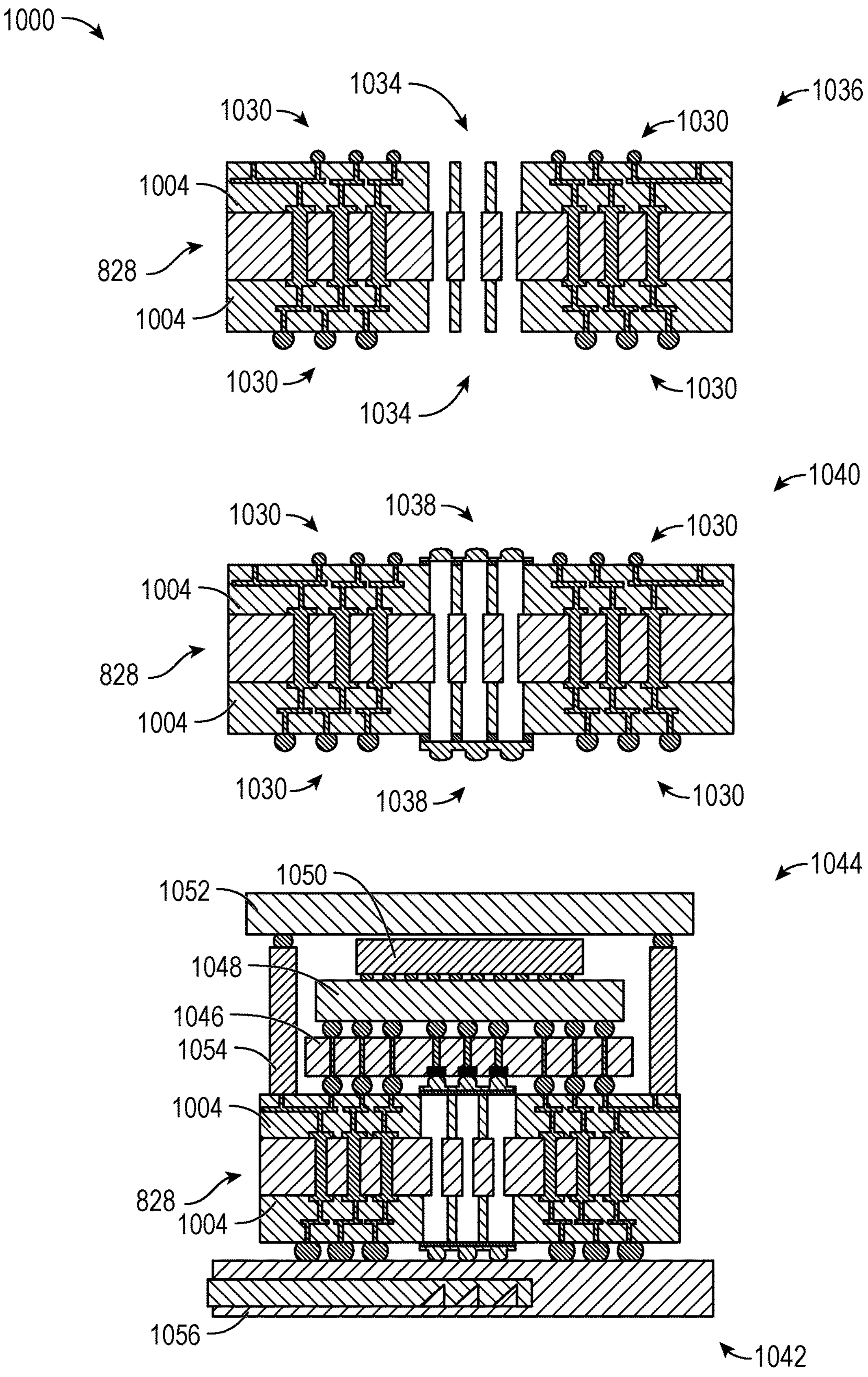

FIGS. 10A and 10B show a process flow 1000 for manufacturing micro electronics package in accordance with at least one example of this disclosure. Process flow 1000 may be a continuation of process flow 800 and may begin at stage 1002 where dielectric layers 1004 may be formed. Dielectric layers 1004 may be formed on glass interposer 828 by a lamination process.

Dielectric layers 1004 may be patterned (1006) to form traces 1008 within dielectric layers 1004. Traces 1008 may form electrical pathways from vias within glass interposer 828 to surfaces of dielectric layers 1004. Micro balls/bumps 1030 may be formed (1032). Cavities 1034 may be formed (1036) in dielectric layers 1004, which may be organic substrate layers. After forming cavities 1034, lens 1038 may be installed (1040) in cavities 1034.

With lens 938 installed microelectronics package 1042 may be assembled (1044). Assembling microelectronics package 1042 may include attaching a photonic integrated glass layer 1046 to bumps 1030 and die 1048 to photonic integrated glass layer 1046. Dies 1050 and 1052 may be stacked upon die 1048. Pillars 1054 may be installed and motherboard 1056 attached to bumps 1030.

Figure 11A:
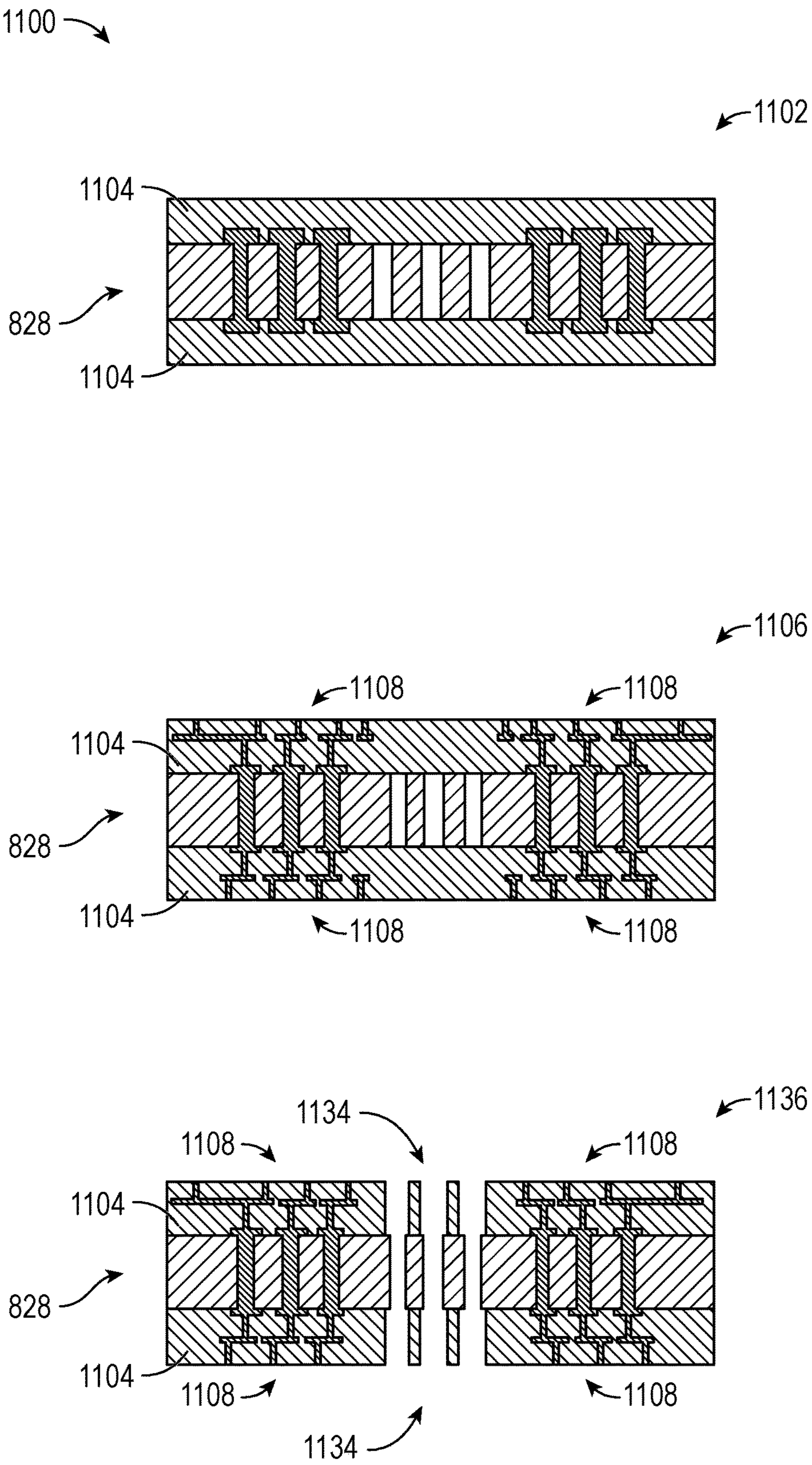
FIGS. 11A, 11B, and 11C show a process flow for manufacturing a micro electronics package in accordance with at least one example of this disclosure.
Figure 11B:
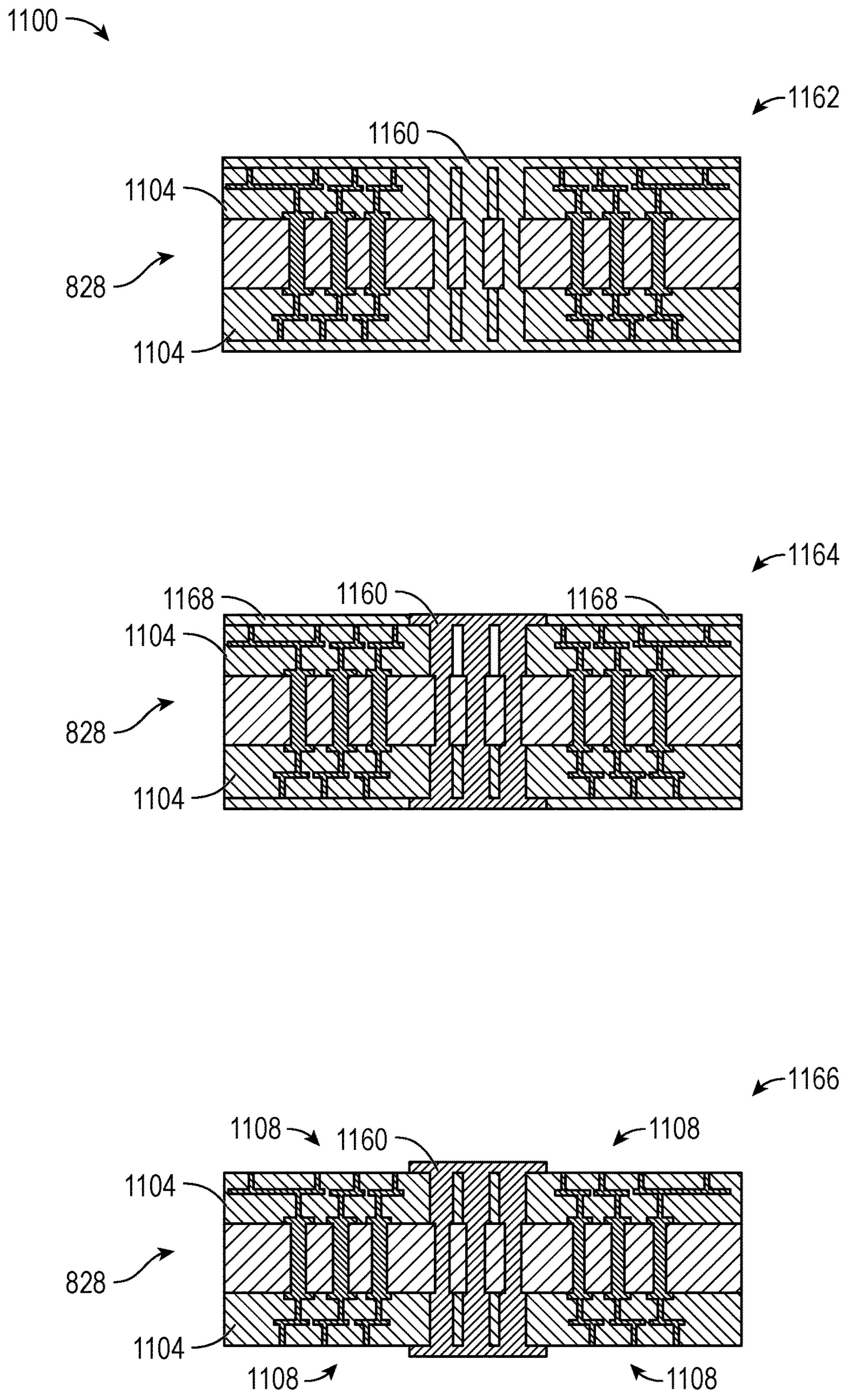
Figure 11C:
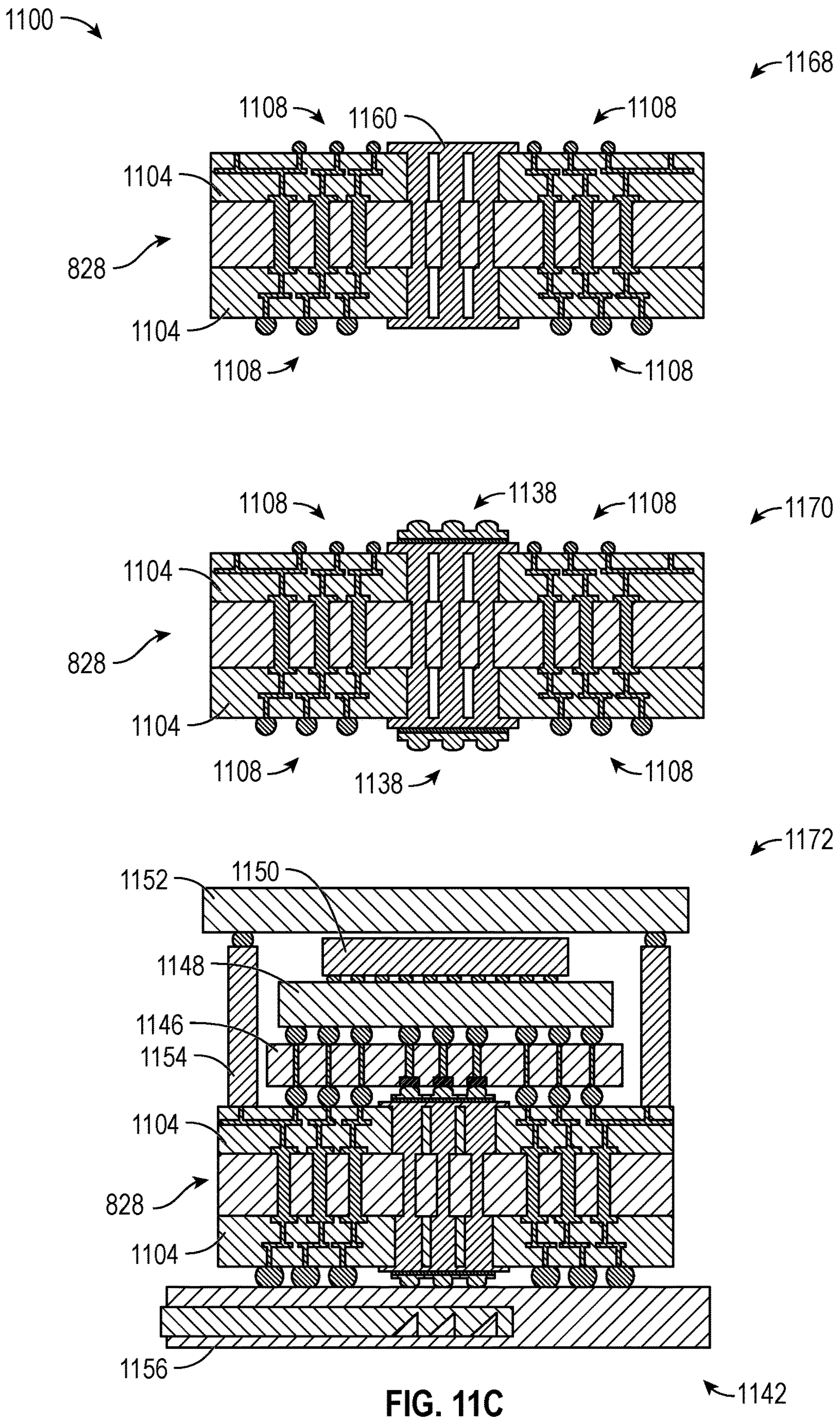
Figure 12A:
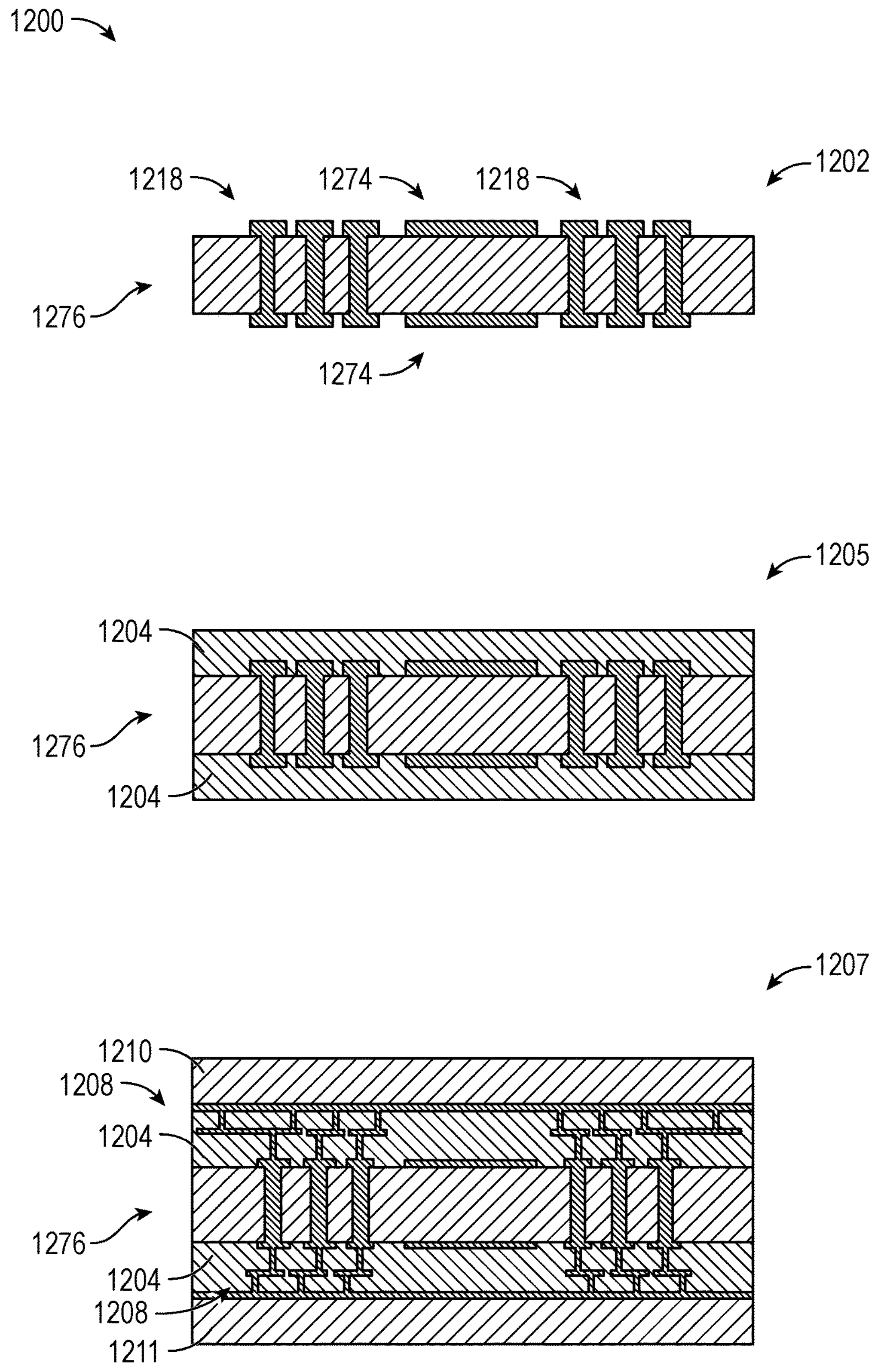
FIGS. 12A, 12B, 12C, and 12D show a process flow for manufacturing a micro electronics package in accordance with at least one example of this disclosure.
Figure 12B:
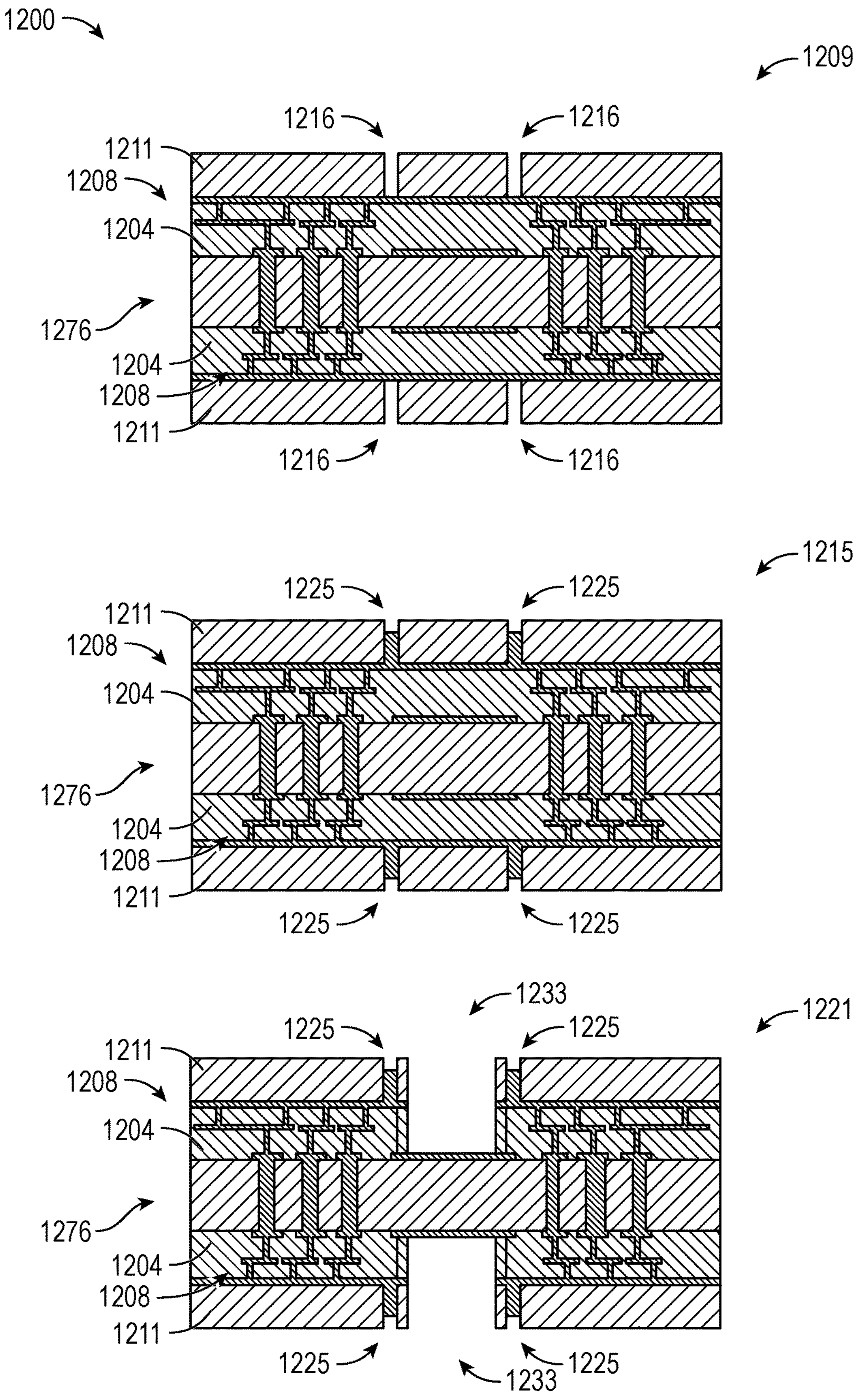
Figure 12C:
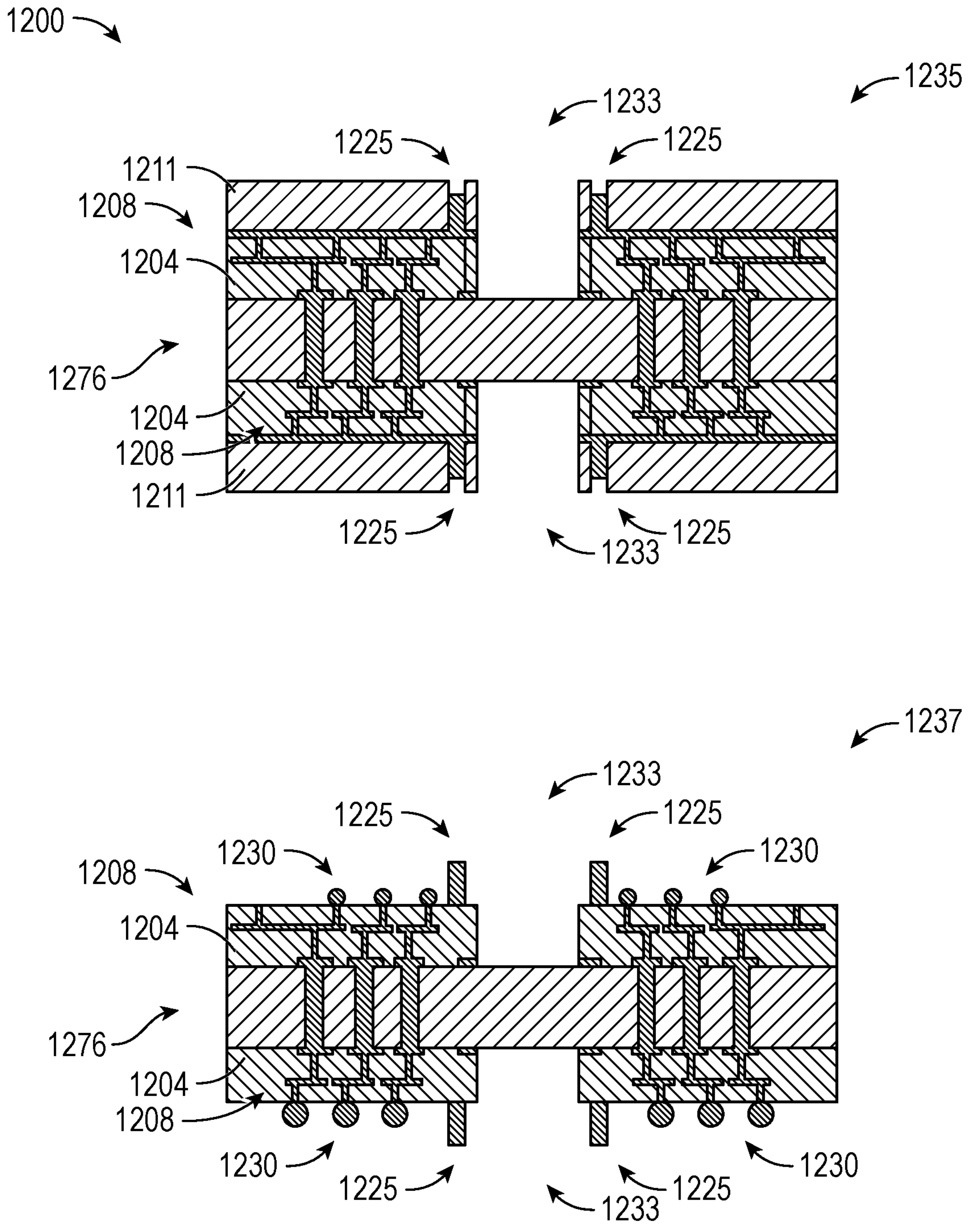
Figure 12D:
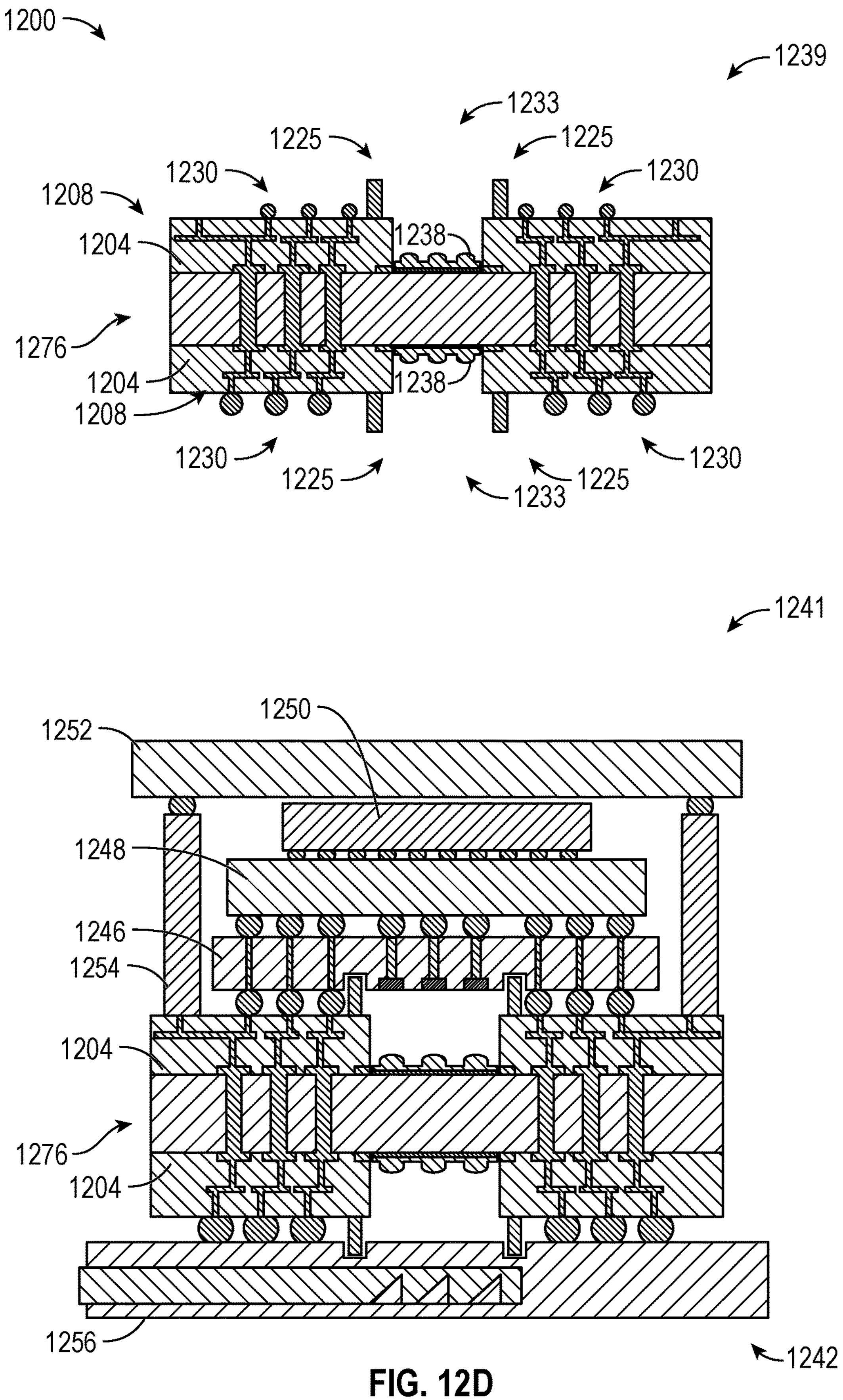

FIGS. 11A, 11B, and 11C show a process flow 1100 for manufacturing micro electronics package in accordance with at least one example of this disclosure. Process flow 1100 may be a continuation of process flow 800 and may begin at stage 1102 where dielectric layers 1104 may be formed. Dielectric layers 1104 may be formed on glass interposer 828 by a lamination process.

Dielectric layers 1104 may be patterned (1106) to form traces 1108 within dielectric layers 1104. Traces 1108 may form electrical pathways from vias within glass interposer 828 to surfaces of dielectric layers 1104. Cavities 1134 may be formed (1136) in dielectric layers 1104, which may be organic substrate layers. After forming cavities 1134, cavities 1134 may be filled with a polymer 1160 (1162), which may also cover surfaces for dielectric layers 1104 as shown in FIG. 11B. Polymer 1160 may be a slit coat polymer material.

Polymer 1160 may be cured (1164). Curing polymer 1160 may include exposing portions of polymer 1160 to ultraviolent (UV) light. Uncured portions of polymer 1160 may be developed (1166), which may remove portions 1168 of polymer 1160 from surfaces of dielectric layers 1104 as shown in FIG. 11B to expose traces 1108. Micro balls/bumps 1130 may be formed (1168).

Lens 1138 may be connected to polymer 1160 (1170). With lens 1138 installed microelectronics package 1142 may be assembled (1172). Assembling microelectronics package 1142 may include attaching a photonic integrated glass layer 1146 to bumps 1130 and die 1148 to photonic integrated glass layer 1146. Dies 1050 and 1052 may be stacked upon die 1048. Pillars 1054 may be installed and motherboard 1056 attached to bumps 1030.

FIGS. 12A, 12B, 12C, and 12D show a process flow 1200 for manufacturing micro electronics package in accordance with at least one example of this disclosure. Process flow 1200 may be a branch of process flow 800 after stage 822 and may begin at stage 1202 where metallic material 1206 may be removed leaving pads 1218 and 1274. For example, an etching process may be used to remove a copper seed material. Stage 1202 for a glass interposer 1276.

Dielectric layers 1204 may be formed on glass interposer 1276 (1205). Dielectric layers 1204 may be formed on glass interposer 1276 by a lamination process. Dielectric layers 1204 may be patterned (1207) to form traces 1208 within dielectric layers 1204. Traces 1208 may form electrical pathways from vias within glass interposer 1276 to surfaces of dielectric layers 1204. During stage 1207 dry film resist layer 1211 may be formed by a lamination or other process.

Dry film resist layer 1211 may be patterned (1209) to form openings 1216. Openings 126 may be filled with an electrical conductor 1225 (1215). And cavities 1233 may be formed (1221). With cavities 1233 formed, dry film resist layers 1211 can be removed and pads 1243 etched (1235) to remove pads 1243. Micro balls/bumps 1230 may be formed (1237).

Lens 1238 may be connected to glass interposer 1276 (1239). With lens 1138 installed microelectronics package 1242 may be assembled (1241). Assembling microelectronics package 1142 may include attaching a photonic integrated glass layer 1146 to bumps 1130 and die 1148 to photonic integrated glass layer 1146. Dies 1050 and 1052 may be stacked upon die 1048. Pillars 1054 may be installed and motherboard 1056 attached to bumps 1030.

Figure 13:
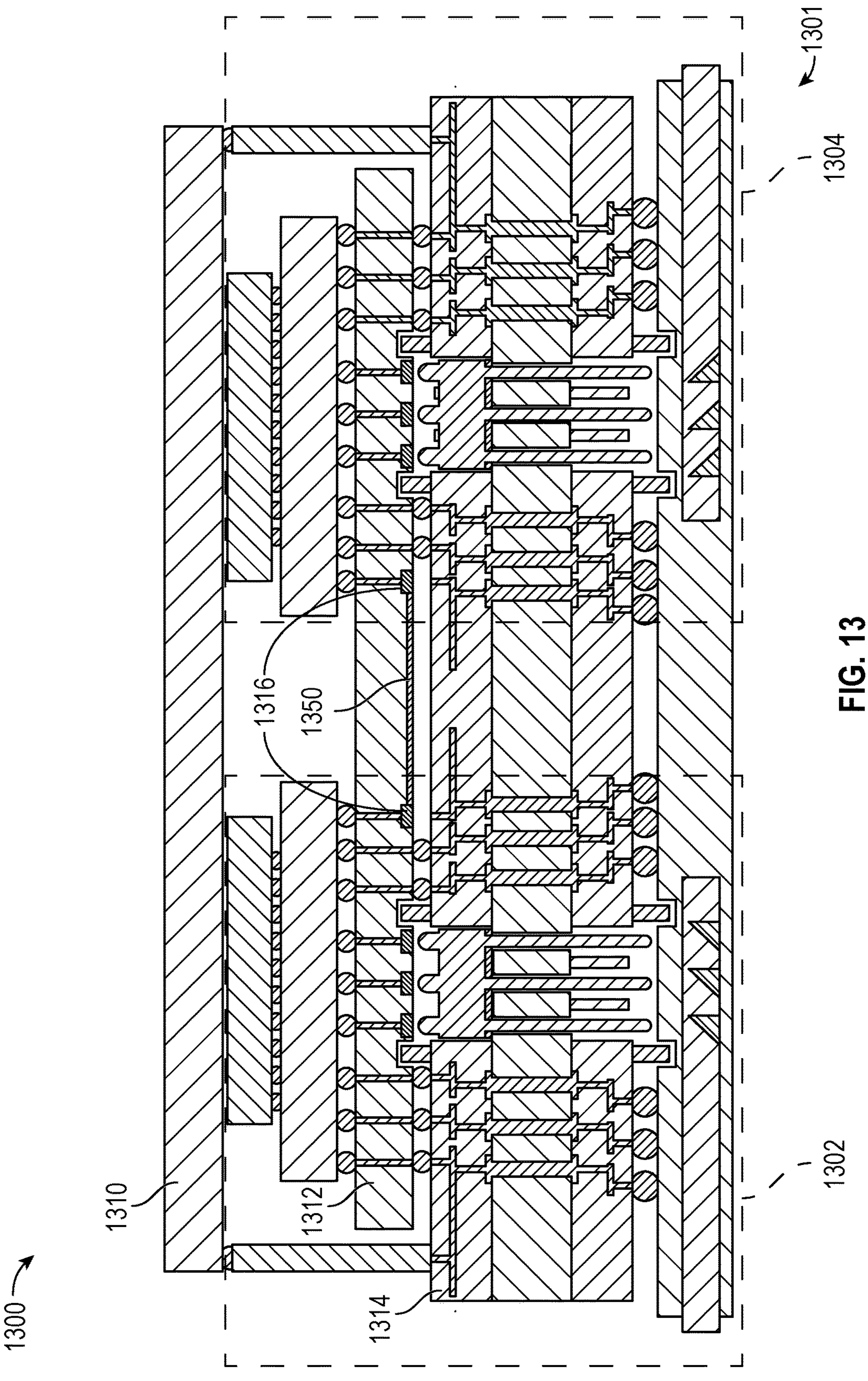
FIG. 13 shows a process flow for manufacturing a micro electronics package in accordance with at least one example of this disclosure.

FIG. 13 shows a process flow 1300 for manufacturing a micro electronics package 1301 in accordance with at least one example of this disclosure. Process flow 1300 may include forming first microelectronics package 1302 and second microelectronics package 1304 using any one of process flows 700, 800, 900, 1000, 1100, or 1200. First and second microelectronics packages 1302, 1304 may share substrates, glass interposers, and photonic integrated glass layers as disclosed herein and shown in FIG. 4. Process flow 1300 may include connecting a die 1310 to both first and second microelectronics packages 1302, 1304. Process flow 1300 may also include implanting a waveguide 1350 and photo detectors 1316 into photonic integrated glass layer 1312 or in between photonic integrated glass layer 1312 and a substrate 1314.

Figure 14:
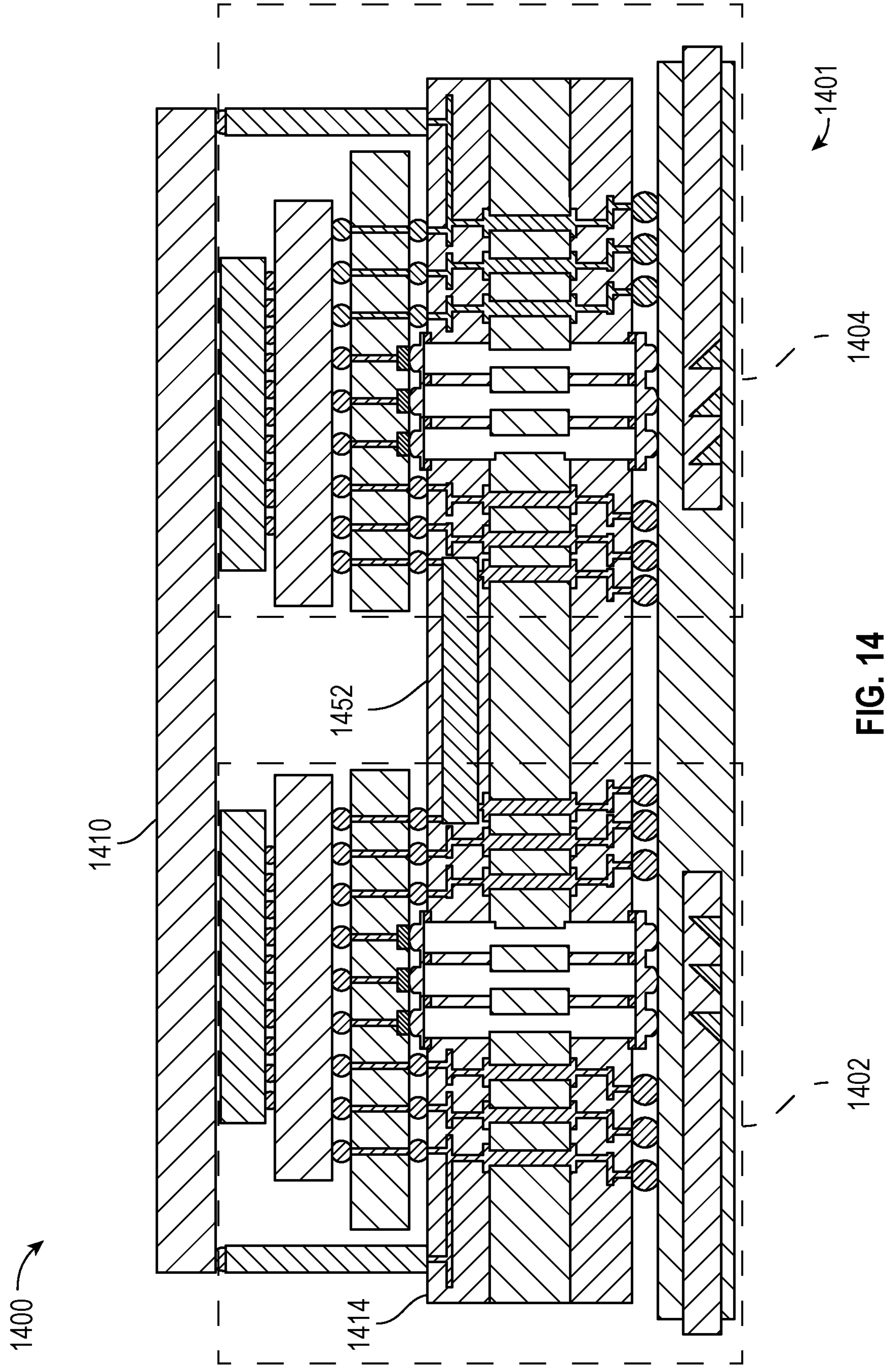
FIG. 14 shows a process flow for manufacturing a micro electronics package in accordance with at least one example of this disclosure.

FIG. 14 shows a process flow 1400 for manufacturing a micro electronics package 1401 in accordance with at least one example of this disclosure. Process flow 1400 may include forming first microelectronics package 1402 and second microelectronics package 1404 using any one of process flows 700, 800, 900, 1000, 1100, or 1200. First and second microelectronics packages 1402, 1404 may share substrates and glass interposers as disclosed herein and shown in FIG. 5. Process flow 1400 may include connecting a die 1410 to both first and second microelectronics packages 1402, 1404. Process flow 1400 may also include implanting a EMIB 1452 into a substrate 1414. EMIB 1452 may be a silicon or glass EMIB as disclosed herein.

Figure 15:
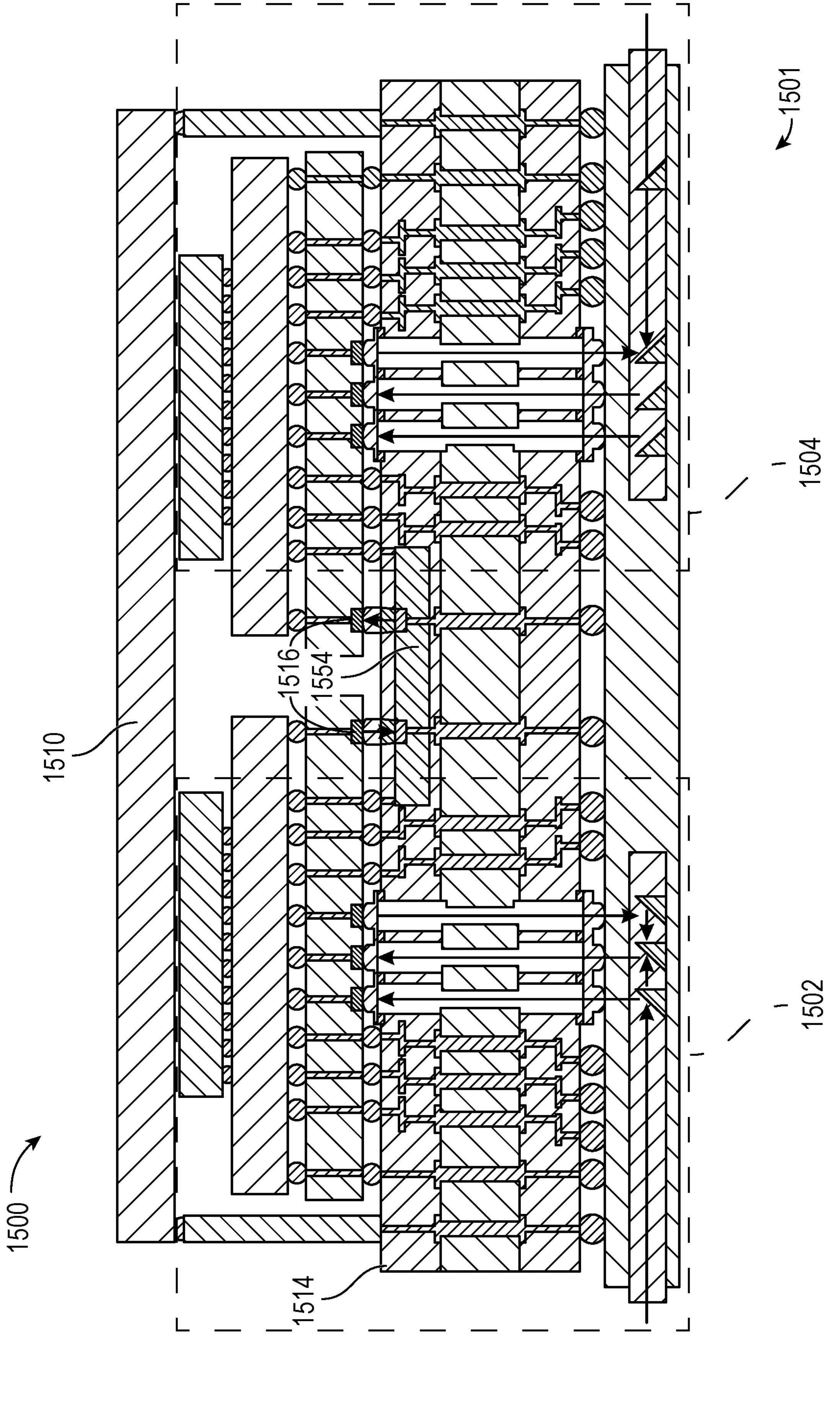
FIG. 15 shows a process flow for manufacturing a micro electronics package in accordance with at least one example of this disclosure.

FIG. 15 shows a process flow 1500 for manufacturing a micro electronics package 1501 in accordance with at least one example of this disclosure. Process flow 1500 may include forming first microelectronics package 1502 and second microelectronics package 1504 using any one of process flows 700, 800, 900, 1000, 1100, or 1200. First and second microelectronics packages 1502, 1504 may share substrates and glass interposers as disclosed herein and shown in FIG. 6. Process flow 1500 may include connecting a die 1510 to both first and second microelectronics packages 1502, 1504. Process flow 1500 may also include implanting a photonic integrated glass layer 1554 and photo detectors 1516 into a substrate 1514.

Figure 16:
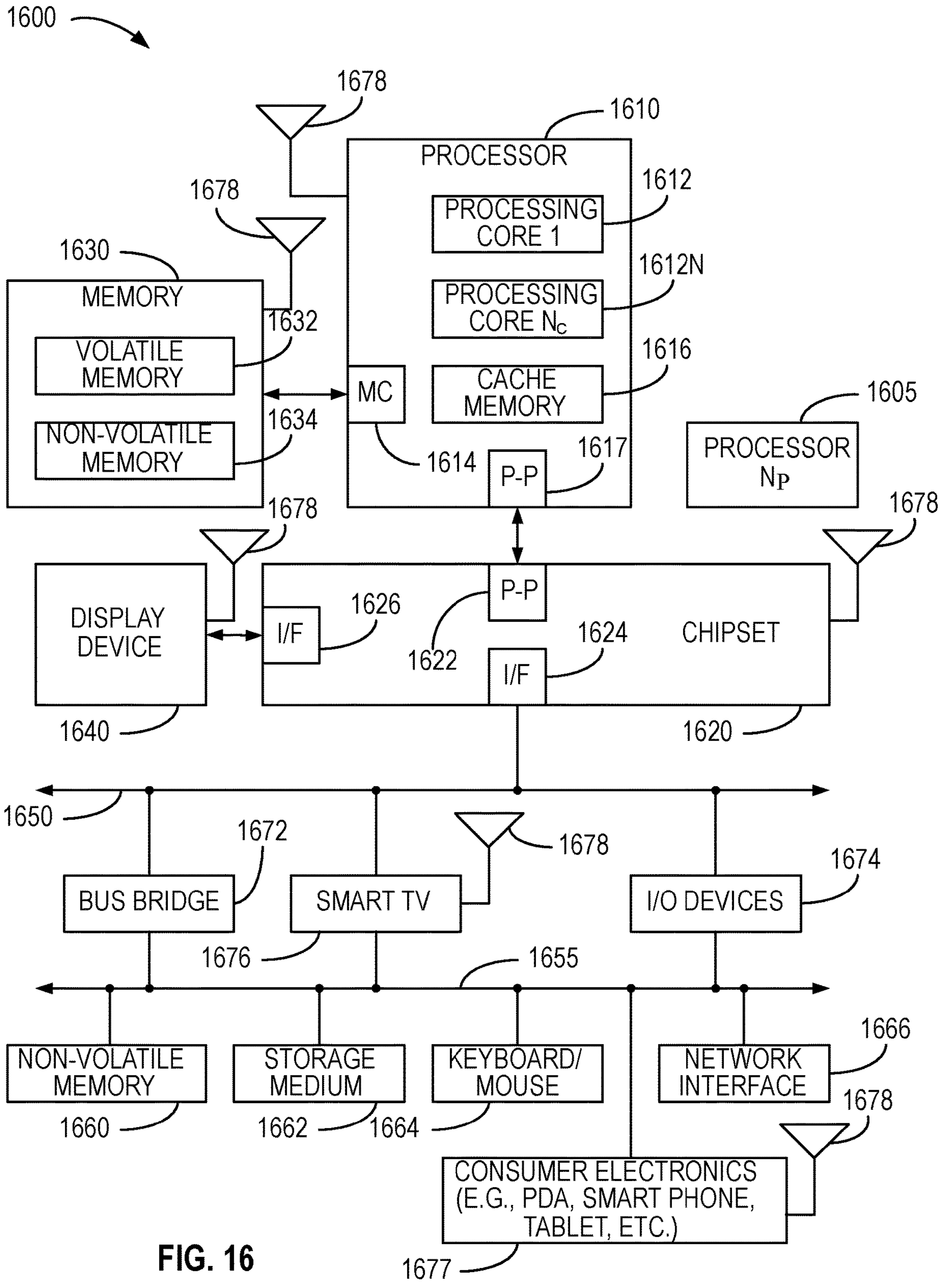
FIG. 16 shows system level diagram in accordance with at least one example of this disclosure.

FIG. 16 illustrates a system level diagram, according to one embodiment of the invention. For instance, FIG. 16 depicts an example of an electronic device (e.g., system) including microelectronics package 100 as described herein. FIG. 16 is included to show an example of a higher-level device application for the present invention. In one embodiment, system 1600 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 1600 is a system on a chip (SOC) system.

In one embodiment, processor 1610 has one or more processing cores 1612 and 1612N, where 1612N represents the Nth processor core inside processor 1610 where N is a positive integer. In one embodiment, system 1600 includes multiple processors including 1610 and 1605, where processor 1605 has logic similar or identical to the logic of processor 1610. In some embodiments, processing core 1612 includes, but is not limited to, pre-fetch logic to fetch instructions, decode logic to decode the instructions, execution logic to execute instructions and the like. In some embodiments, processor 1610 has a cache memory 1616 to cache instructions and/or data for system 1600. Cache memory 1616 may be organized into a hierarchal structure including one or more levels of cache memory.

In some embodiments, processor 1610 includes a memory controller 1614, which is operable to perform functions that enable the processor 1610 to access and communicate with memory 1630 that includes a volatile memory 1632 and/or a non-volatile memory 1634. In some embodiments, processor 1610 is coupled with memory 1630 and chipset 1620. Processor 1610 may also be coupled to a wireless antenna 1678 to communicate with any device configured to transmit and/or receive wireless signals. In one embodiment, the wireless antenna interface 1678 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 1632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 1634 includes, but is not limited to, flash memory, phase change memory (PCM), read-only memory (ROM), electrically erasable programmable read-only memory (EEPROM), or any other type of non-volatile memory device.

Memory 1630 stores information and instructions to be executed by processor 1610. In one embodiment, memory 1630 may also store temporary variables or other intermediate information while processor 1610 is executing instructions. In the illustrated embodiment, chipset 1620 connects with processor 1610 via Point-to-Point (PtP or P-P) interfaces 1617 and 1622. Chipset 1620 enables processor 1610 to connect to other elements in system 1600. In some embodiments of the invention, interfaces 1617 and 1622 operate in accordance with a PtP communication protocol such as the Intel® QuickPath Interconnect (QPI) or the like. In other embodiments, a different interconnect may be used.

In some embodiments, chipset 1620 is operable to communicate with processor 1610, 1605N, display device 1640, and other devices 1672, 1676, 1674, 1660, 1662, 1664, 1666, 1677, etc. Chipset 1620 may also be coupled to a wireless antenna 1678 to communicate with any device configured to transmit and/or receive wireless signals.

Chipset 1620 connects to display device 1640 via interface 1626. Display 1640 may be, for example, a liquid crystal display (LCD), a plasma display, cathode ray tube (CRT) display, or any other form of visual display device. In some embodiments of the invention, processor 1610 and chipset 1620 are merged into a single SOC. In addition, chipset 1620 connects to one or more buses 1650 and 1655 that interconnect various elements 1674, 1660, 1662, 1664, and 1666. Buses 1650 and 1655 may be interconnected together via a bus bridge 1672. In one embodiment, chipset 1620 couples with a non-volatile memory 1660, a mass storage device(s) 1662, a keyboard/mouse 1664, and a network interface 1666 via interface 1624 and/or 1604, smart TV 1676, consumer electronics 1677, etc.

In one embodiment, mass storage device 1662 includes, but is not limited to, a solid state drive, a hard disk drive, a universal serial bus flash memory drive, or any other form of computer data storage medium. In one embodiment, network interface 1666 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 16 are depicted as separate blocks within the system 1600, the functions performed by some of these blocks may be integrated within a single semiconductor circuit or may be implemented using two or more separate integrated circuits. For example, although cache memory 1616 is depicted as a separate block within processor 1610, cache memory 1616 (or selected aspects of 1616) can be incorporated into processor core 1612.

Additional Notes

The following, non-limiting examples, detail certain aspects of the present subject matter to solve the challenges and provide the benefits discussed herein, among others.

Example 1 is a microelectronics package comprising: a first organic substrate comprising a first surface and a second surface, the first organic substrate defining through substrate vias extending from the first surface to the second surface; a photonic integrated glass layer attached to the first surface of the first organic substrate, the photonic integrated glass layer comprising photo detectors; and a glass interposer attached to the second surface of the first organic substrate, the glass interposer defining through glass vias in optical communication with the photo detectors.

In Example 2, the subject matter of Example 1 optionally includes wherein the through glass vias and the substrate vias define optical pathways from a second substrate attached to the glass interposer to the photo detectors.

In Example 3, the subject matter of any one or more of Examples 1-2 optionally include at least one die attached to the photo integrated glass layer.

In Example 4, the subject matter of Example 3 optionally includes wherein the glass interposer and the first organic substrate define electrical pathways to the at least one die attached to the photo integrated glass layer.

In Example 5, the subject matter of any one or more of Examples 1-4 optionally include a waveguide defining an optical pathway from the photonic integrated glass layer to a second photonic integrated glass layer.

In Example 6, the subject matter of any one or more of Examples 1-5 optionally include an optical lens located in between the first organic substrate and the photonic integrated glass layer at each of the through substrate vias.

In Example 7, the subject matter of Example 6 optionally includes wherein the optical lens is a light emitting diode detector.

In Example 8, the subject matter of any one or more of Examples 1-7 optionally include a second substrate; and a glass embedded multi-die interconnect bridge optically connecting the first organic substrate to the second organic substrate.

In Example 9, the subject matter of any one or more of Examples 1-8 optionally include a second photonic integrated glass layer attached to the first organic substrate; and a glass embedded multi-die interconnect bridge optically connecting the first photonic integrated glass layer to the second photonic integrated glass layer.

In Example 10, the subject matter of any one or more of Examples 1-9 optionally include a motherboard in optical communication with the through glass vias.

Example 11 is a microelectronics package comprising: a first organic substrate defining first through substrate vias; a first photonic integrated glass layer attached to the first organic substrate, the first photonic integrated glass layer comprising first photo detectors; a second photonic integrated glass layer attached to the first organic substrate, the second photonic integrated glass layer comprising second photo detectors; a first glass interposer attached to the first organic substrate, the first glass interposer defining: first through glass vias in optical communication with the first photo detectors, and second through glass vias in optical communication with the second photo detectors.

In Example 12, the subject matter of Example 11 optionally includes wherein the first through glass vias, the second through glass vias, and the substrate vias define optical pathways from a second substrate attached to the first glass interposer to the first photo detectors and the second phot detectors.

In Example 13, the subject matter of any one or more of Examples 11-12 optionally include a first die attached to the first photo integrated glass layer; and a second die attached to the second photo integrated glass layer.

In Example 14, the subject matter of Example 13 optionally includes wherein the first glass interposer and the first organic substrate define: first electrical pathways to the first die attached to the first photo integrated glass layer; and second electrical pathways to the second die attached to the second photo integrated glass layer.

In Example 15, the subject matter of any one or more of Examples 11-14 optionally include a waveguide defining an optical pathway from the first photonic integrated glass layer to the second photonic integrated glass layer.

In Example 16, the subject matter of any one or more of Examples 11-15 optionally include an optical lens located in between the first organic substrate and the first a second photonic integrated glass layers at each of the through substrate vias.

In Example 17, the subject matter of Example 16 optionally includes wherein the optical lens is a light emitting diode detector.

In Example 18, the subject matter of any one or more of Examples 11-17 optionally include a second substrate; and a glass embedded multi-die interconnect bridge optically connecting the first organic substrate to the second organic substrate.

In Example 19, the subject matter of any one or more of Examples 11-18 optionally include a glass embedded multi-die interconnect bridge optically connecting the first photonic integrated glass layer to the second photonic integrated glass layer.

In Example 20, the subject matter of any one or more of Examples 11-19 optionally include a motherboard in optical communication with the through glass vias.

Example 21 is a method of manufacturing a microelectronics package, the method comprising: forming through vias in a glass interposer; plating a first subset of the through vias; forming a resist layer on a first surface of the glass interposer; patterning the resist layer; forming pads having a pattern of the resist layer; lamination a first substrate on the first surface of the glass interposer; patterning the first substrate to reveal a second subset of the through vias; and attaching photo detectors to openings of the second subset of through vias, wherein the first subset of through vias for electrical pathways and the second subset of through vias form optical pathways.

In Example 22, the subject matter of Example 21 optionally includes laminating a second substrate on a second surface of the glass layer; patterning the second substrate.

In Example 23, the subject matter of any one or more of Examples 21-22 optionally include forming through vias in a photonic integrated glass layer; and optically coupling the optical pathways to the through vias formed in the photonic integrated glass layer.

In Example 24, the subject matter of Example 23 optionally includes attaching a first die to the photonic integrated glass layer.

In Example 25, the subject matter of any one or more of Examples 23-24 optionally include optically coupling a multi-die interconnect bridge to the first photonic integrated glass layer.

In Example 26, the subject matter of Example 25 optionally includes optically coupling the multi-die interconnect bridge to a second photonic integrated glass layer.

In Example 27, the subject matter of any one or more of Examples 25-26 optionally include embedding the multi-die interconnect bridge at least partially into the first substrate.

In Example 28, the subject matter of any one or more of Examples 25-27 optionally include wherein embedding the multi-die interconnect bridge at least partially into the first substrate comprises embedding a glass multi-die interconnect bridge at least partially into the first substrate.

In Example 29, the subject matter of any one or more of Examples 21-28 optionally include optically coupling a motherboard to the second subset of through vias.

In Example 30, the subject matter of any one or more of Examples 21-29 optionally include filling the second subset of through vias with a polymer.

In Example 31, the microelectronics packages, systems, apparatuses, or method of any one or any combination of Examples 1-30 can optionally be configured such that all elements or options recited are available to use or select from.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A microelectronics package, comprising:

a glass interposer between a first organic substrate and a second organic substrate, the first organic substrate comprising a first surface directly on a first side of the glass interposer and the second organic substrate directly on a second side of the glass interposer, the glass interposer defining through glass vias;

a photonic integrated glass layer attached to a second surface of the first organic substrate opposite the first surface, the photonic integrated glass layer comprising photo detectors; and a lens at least partially within or over a first cavity of the first organic substrate, at least partially within or over the through glass vias, and at least partially within or over a second cavity of the second organic substrate, the lens and the through glass vias defining an optical pathway substantially orthogonal to the first side of the glass interposer, through the first organic substrate, the glass interposer, and the second organic substrate to couple to the photo detectors.

2. The microelectronics package of claim 1, wherein the lens is within the first cavity, the through glass vias, and the second cavity.

3. The microelectronics package of claim 1, wherein the lens is on a polymer material and over the second surface, the polymer material within the first cavity, the through glass vias, and the second cavity.

4. The microelectronics package of claim 1, wherein the lens is over the second surface, and the first cavity, the through glass vias, and the second cavity absent any fill material.

5. The microelectronics package of claim 1, wherein the photonic integrated glass layer comprises an interleaved stack of first and second layers, the first layers comprising glass layers, the second layers comprising dielectric material and patterned metal, and the photo detectors embedded in one of the first layers.

6. The microelectronics package of claim 1, further comprising:

a second photonic integrated glass layer attached to the second surface of the first organic substrate; and a glass embedded multi-die interconnect bridge embedded in the first organic substrate between and optically connecting the photonic integrated glass layer to the second photonic integrated glass layer.

7. The microelectronics package of claim 1, further comprising:

a first die coupled to the photonic integrated glass layer opposite the first organic substrate;

a second die over the first die; and a pillar extending vertically from the second surface of the first organic substrate to a bottom surface of the second die.

8. The microelectronics package of claim 7, further comprising:

a third die between the first die and the second die; and a second pillar extending vertically from a top surface of the photonic integrated glass layer to a bottom surface of the third die.

9. The microelectronics package of claim 1, further comprising a motherboard in optical communication with the through glass vias.

10. The microelectronics package of claim 9, wherein the motherboard comprises glass portions for connection to receive and/or transmit optical signals.

11. A microelectronics package, comprising:

a first organic substrate comprising a first surface, a second surface, and a plurality of metal walls extending from the first surface, the first organic substrate defining a first through opening extending from the first surface to the second surface;

a photonic integrated glass layer attached to the first surface of the first organic substrate, the photonic integrated glass layer defining a plurality of recesses sized to accept a portion of the plurality of metal walls, the photonic integrated glass layer comprising photo detectors located proximate the first through opening; and a glass interposer attached to the second surface of the first organic substrate, the glass interposer defining a second through opening in optical communication with the photo detectors.

12. The microelectronics package of claim 11, wherein the first and second through openings define optical pathways from a second substrate attached to the glass interposer to the photo detectors.

13. The microelectronics package of claim 11, further comprising at least one die attached to the photonic integrated glass layer.

14. The microelectronics package of claim 11, further comprising a waveguide defining an optical pathway from the photonic integrated glass layer to a second photonic integrated glass layer.

15. The microelectronics package of claim 11, further comprising an optical lens between the first organic substrate and the photonic integrated glass layer at the first through opening.

16. The microelectronics package of claim 11, further comprising:

a second organic substrate; and a glass embedded multi-die interconnect bridge optically connecting the first organic substrate to the second organic substrate.

17. The microelectronics package of claim 11, further comprising:

a second photonic integrated glass layer attached to the first organic substrate; and a glass embedded multi-die interconnect bridge optically connecting the photonic integrated glass layer to the second photonic integrated glass layer.

18. The microelectronics package of claim 11, further comprising a motherboard in optical communication with through glass vias defined by the glass interposer.

19. A microelectronics package, comprising:

a glass interposer between a first organic substrate comprising first traces and a second organic substrate comprising second traces, the first organic substrate comprising a first surface directly on a first side of the glass interposer and the second organic substrate directly on a second side of the glass interposer, the glass interposer defining through glass vias;

a photonic integrated glass layer comprising an interleaved stack of glass layers and dielectric and patterned metal layers and one or more photo detectors embedded in one of the glass layers, the photonic integrated glass layer attached to a second surface of the first organic substrate opposite the first surface; and a lens at least partially within or over a first cavity of the first organic substrate, at least partially within or over the through glass vias, and at least partially within or over a second cavity of the second organic substrate, the lens and the through glass vias defining an optical pathway substantially orthogonal to the first side of the glass interposer, through the first organic substrate, the glass interposer, and the second organic substrate to couple to the photo detectors.

20. The microelectronics package of claim 19, wherein the lens is within the first cavity, the through glass vias, and the second cavity.

21. The microelectronics package of claim 19, wherein the lens is on a polymer material and over the second surface, the polymer material within the first cavity, the through glass vias, and the second cavity.

22. The microelectronics package of claim 19, further comprising:

a second photonic integrated glass layer attached to the second surface of the first organic substrate; and a glass embedded multi-die interconnect bridge embedded in the first organic substrate between and optically connecting the photonic integrated glass layer to the second photonic integrated glass layer.

23. The microelectronics package of claim 19, further comprising:

a first die coupled to the photonic integrated glass layer opposite the first organic substrate;

a second die over the first die; and a pillar extending vertically from the second surface of the first organic substrate to a bottom surface of the second die.

24. The microelectronics package of claim 19, further comprising a motherboard in optical communication with the through glass vias.

* * * * *